US011227745B2

(12) United States Patent
Miller et al.

(10) Patent No.: US 11,227,745 B2
(45) Date of Patent: Jan. 18, 2022

(54) PLASMA SHEATH CONTROL FOR RF PLASMA REACTORS

(71) Applicant: Eagle Harbor Technologies, Inc., Seattle, WA (US)

(72) Inventors: Kenneth Miller, Seattle, WA (US); Timothy Ziemba, Bainbridge Island, WA (US); James Prager, Seattle, WA (US); Ilia Slobodov, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 0 days.

(21) Appl. No.: 16/537,513

(22) Filed: Aug. 9, 2019

(65) Prior Publication Data
US 2020/0051785 A1 Feb. 13, 2020

Related U.S. Application Data

(60) Provisional application No. 62/717,523, filed on Aug. 10, 2018, provisional application No. 62/774,078, (Continued)

(51) Int. Cl.
*H01J 37/32* (2006.01)
(52) U.S. Cl.
CPC .. *H01J 37/32128* (2013.01); *H01J 37/32431* (2013.01)
(58) Field of Classification Search
CPC .............. H01J 37/32128; H01J 37/32431
See application file for complete search history.

(56) References Cited

U.S. PATENT DOCUMENTS 3,339,108 A 8/1967 Holtje
4,070,589 A 1/1978 Martinkovic
(Continued)

FOREIGN PATENT DOCUMENTS

CA 2292526 A1 12/1999
EP 174164 A2 3/1986
(Continued)

OTHER PUBLICATIONS

International Search Report and Written Opinion as issued in connection with International Patent Application No. PCT/US20/16253, dated Apr. 29, 2020, 5 pages.
(Continued)

*Primary Examiner* — Borna Alaeddini

(57) ABSTRACT

Some embodiments include a plasma sheath control system that includes an RF power supply producing an A sinusoidal waveform with a frequency greater than 20 kHz and a peak voltage greater than 1 kV and a plasma chamber electrically coupled with the RF power supply, the plasma chamber having a plurality of ions that are accelerated into a surface disposed with energies greater than about 1 kV, and the plasma chamber produces a plasma sheath within the plasma chamber from the sinusoidal waveform. The plasma sheath control system includes a blocking diode electrically connected between the RF power supply and the plasma chamber and a capacitive discharge circuit electrically coupled with the RF power supply, the plasma chamber, and the blocking diode; the capacitive discharge circuit discharges capacitive charges within the plasma chamber with a peak voltage greater than 1 kV and a discharge time that less than 250 nanoseconds.

8 Claims, 19 Drawing Sheets

Related U.S. Application Data filed on Nov. 30, 2018, provisional application No. 62/789,523, filed on Jan. 8, 2019, provisional application No. 62/789,526, filed on Jan. 8, 2019.

(56) References Cited

U.S. PATENT DOCUMENTS

| | | | |
|---|---|---|---|
| 4,076,996 A | 2/1978 | Maehara et al. | |
| 4,438,331 A | 3/1984 | Davis | |
| 4,504,895 A | 3/1985 | Steigerwald | |
| 4,692,851 A | 9/1987 | Attwood | |
| 4,885,074 A | 12/1989 | Susko et al. | |
| 4,924,191 A | 5/1990 | Erb et al. | |
| 4,992,919 A | 2/1991 | Lee et al. | |
| 5,140,510 A | 8/1992 | Myers | |
| 5,313,481 A | 5/1994 | Cook et al. | |
| 5,321,597 A | 6/1994 | Alacoque | |
| 5,325,021 A | 6/1994 | Duckworth | |
| 5,392,043 A | 2/1995 | Ribner | |
| 5,451,846 A | 9/1995 | Peterson et al. | |
| 5,488,552 A | 1/1996 | Sakamoto et al. | |
| 5,610,452 A | 3/1997 | Shimer et al. | |
| 5,623,171 A | 4/1997 | Nakajima | |
| 5,656,123 A * | 8/1997 | Salimian | C23C 16/509 |
| | | | 156/345.43 |
| 5,729,562 A | 3/1998 | Birx et al. | |
| 5,796,598 A | 8/1998 | Nowak et al. | |
| 5,808,504 A | 9/1998 | Chikai et al. | |
| 5,905,646 A | 5/1999 | Crewson et al. | |
| 5,930,125 A | 7/1999 | Hitchcock et al. | |
| 5,933,335 A | 8/1999 | Hitchcock et al. | |
| 5,968,377 A | 10/1999 | Yuasa et al. | |
| 6,059,935 A * | 5/2000 | Spence | H01J 37/32 |
| | | | 204/156 |
| 6,066,901 A | 5/2000 | Burkhart et al. | |
| 6,087,871 A | 7/2000 | Kardo-Syssoev et al. | |
| 6,205,074 B1 | 3/2001 | Van Buskirk et al. | |
| 6,222,321 B1 | 4/2001 | Scholl et al. | |
| 6,238,387 B1 * | 5/2001 | Miller, III | A61B 18/1206 |
| | | | 606/34 |
| 6,239,403 B1 | 5/2001 | Dible et al. | |
| 6,253,704 B1 | 7/2001 | Savas | |
| 6,300,720 B1 | 10/2001 | Birx | |
| 6,359,542 B1 | 3/2002 | Widmayer et al. | |
| 6,362,604 B1 | 3/2002 | Cravey | |
| 6,392,187 B1 | 5/2002 | Johnson | |
| 6,483,731 B1 | 11/2002 | Isurin et al. | |
| 6,496,047 B1 | 12/2002 | Iskander et al. | |
| 6,518,195 B1 | 2/2003 | Collins et al. | |
| 6,577,135 B1 | 6/2003 | Matthews et al. | |
| 6,741,120 B1 | 5/2004 | Tan | |
| 6,741,484 B2 | 5/2004 | Crewson | |
| 6,831,377 B2 | 12/2004 | Yampolsky et al. | |
| 6,897,574 B2 | 5/2005 | Vaysee | |
| 6,947,300 B2 | 9/2005 | Pai et al. | |
| 7,061,230 B2 | 6/2006 | Kleine et al. | |
| 7,180,082 B1 | 2/2007 | Hassanein et al. | |
| 7,256,637 B2 | 8/2007 | Iskander et al. | |
| 7,291,545 B2 | 11/2007 | Collins et al. | |
| 7,307,375 B2 | 12/2007 | Smith et al. | |
| 7,319,579 B2 | 1/2008 | Inoue et al. | |
| 7,354,501 B2 | 4/2008 | Gondhalekar et al. | |
| 7,393,765 B2 | 7/2008 | Hanawa | |
| 7,396,746 B2 | 7/2008 | Walther et al. | |
| 7,492,138 B2 | 2/2009 | Zhang et al. | |
| 7,512,433 B2 | 3/2009 | Bernhart et al. | |
| 7,521,370 B2 | 4/2009 | Hoffman | |
| 7,549,461 B2 | 6/2009 | Kroliczek et al. | |
| 7,601,619 B2 | 10/2009 | Okumura et al. | |
| 7,605,385 B2 | 10/2009 | Bauer | |
| 7,615,931 B2 | 11/2009 | Hooke et al. | |
| 7,767,433 B2 | 8/2010 | Kuthi et al. | |
| 7,901,930 B2 | 3/2011 | Kuthi et al. | |
| 7,936,544 B2 | 5/2011 | Beland | |
| 7,943,006 B2 | 5/2011 | Hoffman | |
| 7,948,185 B2 | 5/2011 | Smith et al. | |
| 8,093,797 B2 | 1/2012 | Tyldesley | |
| 8,093,979 B2 | 1/2012 | Wilson | |
| 8,115,343 B2 | 2/2012 | Sanders et al. | |
| 8,120,207 B2 | 2/2012 | Sanders et al. | |
| 8,129,653 B2 | 3/2012 | Kirchmeier et al. | |
| 8,143,790 B2 | 3/2012 | Smith et al. | |
| 8,222,936 B2 | 7/2012 | Friedman et al. | |
| 8,259,476 B2 | 9/2012 | Ben-Yaakov et al. | |
| 8,436,602 B2 | 5/2013 | Skyes | |
| 8,450,985 B2 | 5/2013 | Gray et al. | |
| 8,471,642 B2 | 6/2013 | Hill | |
| 8,575,843 B2 * | 11/2013 | Moore | A61B 18/042 |
| | | | 315/111.21 |
| 8,723,591 B2 | 5/2014 | Lee et al. | |
| 8,773,184 B1 | 7/2014 | Petrov | |
| 8,847,433 B2 | 9/2014 | Vandermey | |
| 8,963,377 B2 | 2/2015 | Ziemba et al. | |
| 9,067,788 B1 | 6/2015 | Spielman et al. | |
| 9,070,396 B1 | 6/2015 | Katchmart et al. | |
| 9,122,350 B2 | 9/2015 | Kao et al. | |
| 9,122,360 B2 | 9/2015 | Xu | |
| 9,287,086 B2 | 3/2016 | Brouk et al. | |
| 9,287,092 B2 | 3/2016 | Brouk et al. | |
| 9,306,533 B1 | 4/2016 | Mavretic | |
| 9,329,256 B2 | 5/2016 | Dolce | |
| 9,417,739 B2 | 8/2016 | Cordeiro et al. | |
| 9,435,029 B2 | 9/2016 | Brouk et al. | |
| 9,493,765 B2 | 11/2016 | Krishnaswamy | |
| 9,515,633 B1 | 12/2016 | Long et al. | |
| 9,601,283 B2 | 3/2017 | Ziemba et al. | |
| 9,655,221 B2 | 5/2017 | Ziemba et al. | |
| 9,706,630 B2 | 7/2017 | Miller | |
| 9,729,122 B2 | 8/2017 | Mavretic | |
| 9,767,988 B2 | 9/2017 | Brouk et al. | |
| 9,881,772 B2 | 1/2018 | Marakhatanov et al. | |
| 9,960,763 B2 | 5/2018 | Miller et al. | |
| 9,966,231 B2 | 5/2018 | Boswell et al. | |
| 10,009,024 B2 | 6/2018 | Gan et al. | |
| 10,020,800 B2 | 7/2018 | Prager et al. | |
| 10,027,314 B2 | 7/2018 | Prager et al. | |
| 10,483,089 B2 | 1/2019 | Ziemba | |
| 10,217,608 B2 | 2/2019 | Mavretic | |
| 10,224,822 B2 | 3/2019 | Miller | |
| 10,301,587 B2 | 5/2019 | Krishnaswamy et al. | |
| 10,304,661 B2 | 5/2019 | Ziemba | |
| 10,373,755 B2 | 8/2019 | Prager et al. | |
| 10,373,804 B2 | 8/2019 | Koh et al. | |
| 10,382,022 B2 | 8/2019 | Prager et al. | |
| 10,448,494 B1 | 10/2019 | Dorf et al. | |
| 10,460,910 B2 | 10/2019 | Ziemba et al. | |
| 10,460,911 B2 | 10/2019 | Ziemba | |
| 10,483,090 B2 | 11/2019 | Bhutta et al. | |
| 10,510,575 B2 | 12/2019 | Kraus et al. | |
| 10,555,412 B2 | 2/2020 | Dorf et al. | |
| 10,607,814 B2 | 3/2020 | Ziemba et al. | |
| 10,631,395 B2 | 4/2020 | Sanders et al. | |
| 10,659,019 B2 | 5/2020 | Slobodov | |
| 10,777,388 B2 | 9/2020 | Ziemba et al. | |
| 10,796,887 B2 | 10/2020 | Prager et al. | |
| 10,876,241 B2 | 12/2020 | Hu et al. | |
| 10,892,140 B2 | 1/2021 | Ziemba et al. | |
| 10,896,809 B2 | 1/2021 | Ziemba et al. | |
| 10,903,047 B2 | 1/2021 | Ziemba et al. | |
| 2001/0008552 A1 | 7/2001 | Harada et al. | |
| 2002/0186577 A1 | 12/2002 | Kirbie | |
| 2003/0021125 A1 | 1/2003 | Rufer et al. | |
| 2003/0054647 A1 | 3/2003 | Suemasa et al. | |
| 2003/0071035 A1 | 4/2003 | Brailove | |
| 2003/0137791 A1 | 7/2003 | Arnet et al. | |
| 2003/0169107 A1 | 9/2003 | LeChevalier | |
| 2004/0085784 A1 | 5/2004 | Salama et al. | |
| 2004/0263412 A1 | 6/2004 | Pribyl | |
| 2004/0149217 A1 | 8/2004 | Collins et al. | |
| 2005/0152159 A1 | 7/2005 | Isurin et al. | |
| 2005/0270096 A1 | 12/2005 | Coleman | |
| 2006/0048894 A1 | 3/2006 | Yamazaki et al. | |
| 2006/0192774 A1 | 8/2006 | Yasumura | |
| 2006/0210020 A1 | 9/2006 | Takahashi et al. | |

(56) References Cited

U.S. PATENT DOCUMENTS

| | | |
|---|---|---|
| 2006/0274887 A1 | 12/2006 | Sakamoto et al. |
| 2007/0018504 A1 | 1/2007 | Weiner et al. |
| 2007/0114981 A1 | 5/2007 | Vasquez et al. |
| 2007/0115705 A1 | 5/2007 | Gotzenberger et al. |
| 2007/0212811 A1 | 9/2007 | Hanawa et al. |
| 2007/0235412 A1 | 10/2007 | Fischer |
| 2008/0062733 A1 | 3/2008 | Gay |
| 2008/0106151 A1 | 5/2008 | Ryoo et al. |
| 2008/0143260 A1 | 6/2008 | Tuymer et al. |
| 2008/0198634 A1 | 8/2008 | Scheel et al. |
| 2008/0231337 A1 | 9/2008 | Krishnaswamy et al. |
| 2008/0252225 A1 | 10/2008 | Kurachi et al. |
| 2008/0272706 A1 | 11/2008 | Kwon et al. |
| 2009/0016549 A1 | 1/2009 | French et al. |
| 2009/0255800 A1 | 10/2009 | Koshimizu |
| 2010/0007358 A1 | 1/2010 | Schaerrer et al. |
| 2010/0148847 A1 | 6/2010 | Schurack et al. |
| 2010/0284208 A1 | 11/2010 | Nguyen et al. |
| 2011/0001438 A1 | 1/2011 | Chemel et al. |
| 2011/0140607 A1 | 6/2011 | Moore et al. |
| 2011/0309748 A1 | 12/2011 | Xia |
| 2012/0016282 A1 | 1/2012 | Van Brunt et al. |
| 2012/0081350 A1 | 4/2012 | Sano et al. |
| 2012/0155613 A1 | 6/2012 | Caiafa et al. |
| 2013/0024784 A1 | 1/2013 | Lifton |
| 2013/0027848 A1 | 1/2013 | Said |
| 2013/0059448 A1 | 3/2013 | Marakhtanov et al. |
| 2013/0075390 A1 | 3/2013 | Ashida |
| 2013/0092529 A1 | 4/2013 | Singh et al. |
| 2013/0113650 A1 | 5/2013 | Behbahani et al. |
| 2013/0174105 A1 | 7/2013 | Nishio et al. |
| 2013/0175575 A1 | 7/2013 | Ziemba et al. |
| 2014/0009969 A1* | 1/2014 | Yuzurihara ............. H02M 7/48 363/17 |
| 2014/0021180 A1 | 1/2014 | Vogel |
| 2014/0077611 A1 | 3/2014 | Young et al. |
| 2014/0109886 A1 | 4/2014 | Singleton et al. |
| 2014/0118414 A1 | 5/2014 | Seo et al. |
| 2014/0146571 A1 | 5/2014 | Ryoo et al. |
| 2014/0268968 A1 | 9/2014 | Richardson |
| 2014/0354343 A1 | 12/2014 | Ziemba et al. |
| 2015/0028932 A1 | 1/2015 | Ziemba et al. |
| 2015/0076372 A1 | 3/2015 | Ziemba et al. |
| 2015/0084509 A1 | 3/2015 | Yuzurihara et al. |
| 2015/0130525 A1 | 5/2015 | Miller et al. |
| 2015/0206716 A1 | 7/2015 | Kim et al. |
| 2015/0256086 A1 | 9/2015 | Miller et al. |
| 2015/0303914 A1 | 10/2015 | Ziemba et al. |
| 2015/0311680 A1 | 10/2015 | Burrows et al. |
| 2015/0318846 A1 | 11/2015 | Prager et al. |
| 2016/0020070 A1 | 1/2016 | Kim et al. |
| 2016/0020072 A1 | 1/2016 | Brouk et al. |
| 2016/0020672 A1 | 1/2016 | Shuck et al. |
| 2016/0182001 A1 | 6/2016 | Zeng et al. |
| 2016/0241234 A1 | 8/2016 | Mavretic |
| 2016/0327029 A1 | 11/2016 | Ziemba et al. |
| 2016/0327089 A1 | 11/2016 | Adam et al. |
| 2016/0358755 A1 | 12/2016 | Long et al. |
| 2017/0104469 A1 | 4/2017 | Mavretic |
| 2017/0154726 A1 | 6/2017 | Prager et al. |
| 2017/0243731 A1 | 8/2017 | Ziemba et al. |
| 2017/0294842 A1 | 10/2017 | Miller et al. |
| 2017/0311431 A1 | 10/2017 | Park |
| 2017/0330729 A1 | 11/2017 | Mavretic |
| 2017/0359886 A1 | 12/2017 | Binderbauer et al. |
| 2017/0366173 A1 | 12/2017 | Miller et al. |
| 2018/0041183 A1 | 2/2018 | Mavretic et al. |
| 2018/0226896 A1 | 8/2018 | Miller et al. |
| 2018/0286636 A1 | 10/2018 | Ziemba et al. |
| 2018/0315583 A1 | 11/2018 | Luere et al. |
| 2018/0374689 A1 | 12/2018 | Abraham et al. |
| 2019/0074806 A1 | 3/2019 | Scott et al. |
| 2019/0080884 A1 | 3/2019 | Ziemba et al. |
| 2019/0131110 A1 | 5/2019 | Ziemba et al. |
| 2019/0157044 A1 | 5/2019 | Ziemba et al. |
| 2019/0157980 A1 | 5/2019 | Li et al. |
| 2019/0172683 A1* | 6/2019 | Mavretic ............ H01L 21/31116 |
| 2019/0172685 A1 | 6/2019 | Van Zyl et al. |
| 2019/0180982 A1 | 6/2019 | Brouk et al. |
| 2019/0228952 A1 | 7/2019 | Dorf |
| 2019/0236426 A1 | 8/2019 | Zhang et al. |
| 2019/0295821 A1 | 9/2019 | Shoeb et al. |
| 2019/0326092 A1 | 10/2019 | Ogasawara |
| 2019/0348258 A1 | 11/2019 | Koh et al. |
| 2019/0350072 A1* | 11/2019 | Dorf ...................... H01J 37/08 |
| 2019/0393791 A1 | 12/2019 | Ziemba et al. |
| 2020/0035457 A1 | 1/2020 | Ziemba et al. |
| 2020/0035458 A1 | 1/2020 | Ziemba et al. |
| 2020/0037468 A1 | 1/2020 | Ziemba et al. |
| 2020/0043702 A1 | 2/2020 | Ziemba et al. |
| 2020/0051786 A1 | 2/2020 | Ziemba et al. |
| 2020/0144030 A1 | 5/2020 | Prager et al. |
| 2020/0168437 A1 | 5/2020 | Ziemba et al. |
| 2020/0176221 A1 | 6/2020 | Prager et al. |

FOREIGN PATENT DOCUMENTS

| | | |
|---|---|---|
| EP | 0947048 A1 | 10/1999 |
| EP | 1128557 A2 | 8/2001 |
| EP | 1515430 A1 | 3/2005 |
| FR | 2771563 B1 | 5/1999 |
| JP | 2000268996 A | 9/2000 |
| JP | 2009263778 A | 11/2009 |
| TW | 200739723 A | 10/2007 |
| TW | 201515525 A | 4/2015 |
| WO | 1997/038479 A1 | 10/1997 |
| WO | 0193419 A1 | 12/2001 |
| WO | 2017126662 A1 | 7/2017 |
| WO | 2018186901 A1 | 10/2018 |

OTHER PUBLICATIONS

Bland, M.J., et al., "A High Power RF Power Supply for High Energy Physics Applications," Proceedings of 2005 the Particle Accelerator Conference, IEEE pp. 4018-4020 (May 16-20, 2005).

Dammertz, G., et al., "Development of Multimegawatt Gyrotrons for Fusion Plasma Heating and current Drive," IEEE transactions on Electron Devices, vol. 52, No. 5, pp. 808-817 (Apr. 2005) (Abstract).

Garwin, R., "Pulsed Power Peer Review Committee Report," Sandia National Laboratories Report, SAND2000-2515, pp. 3-38 (Oct. 2000).

Gaudet, J.A., et al., "Research issues in Developing Compact Pulsed Power for High Peak Power Applications on Mobile Platforms," Proceedings of the IEEE, vol. 92, No. 7, pp. 1144-1165 (Jul. 2004).

In, Y., et al., "On the roles of direct feedback and error field correction in stabilizing resistive-wall modes," Nuclear 2 Fusion, vol. 50, No. 4, pp. 1-5 (2010).

Kim, J.H., et al., "High Voltage Pulsed Power Supply Using IGBT Stacks," IEEE Transactions on Dielectrics and Electrical insulation, vol. 14, No. 4, pp. 921-926 (Aug. 2007).

Locher, R., "Introduction to Power MOSFETs and their Applications (Application Note 558)," Fairchild Semiconductor, 15 pages (Oct. 1998).

Locher, R.E., and Pathak, A.D., "Use of BiMOSFETs in Modem Radar Transmitters," IEEE International Conference on Power Electronics and Drive Systems, pp. 776-782 (2001).

Pokryvailo, A., et al., "A 1KW Pulsed Corona System for Pollution Control Applications," 14th IEEE International Pulsed Power Conference, Dallas, TX, USA (Jun. 15-18, 2003).

Pokryvailo, A., et al., "High-Power Pulsed Corona for Treatment of Pollutants in Heterogeneous Media," IEEE Transactions on Plasma Science, vol. 34, No. 5, pp. 1731-1743 (Oct. 2006) (Abstract).

Quinley, M., et al., "High Voltage Nanosecond Pulser Operating at 30 kW and 400 kHz" APS-GEC-2018, 1 page (2018).

Rao, X., et al., "Combustion Dynamics of Plasma-Enhanced Premixed and Nonpremixed Flames," IEEE Transactions on Plasma Science, vol. 38, No. 12, pp. 3265-3271 (Dec. 2010).

Reass, W.A., et al., "Progress Towards a 20 KV, 2 KA Plasma Source Ion Implantation Modulator for Automotive Production of

(56) References Cited

OTHER PUBLICATIONS

Diamond Film on Aluminum," Submitted to 22nd International Power Symposium, Boca Raton, FL, 6 pages (Jun. 24-27, 1996).
Sanders, J.M., et al., "Scalable, compact, nanosecond pulse generator with a high repetition rate for biomedical applications requiring intense electric fields," 2009 IEEE Pulsed Power Conference, Washington, DC, 2 pages (Jun. 28, 2009-Jul. 2, 2009) (Abstract).
Schamiloglu, E., et al., "Scanning the Technology: Modern Pulsed Power: Charlie Martin and Beyond," Proceedings of the IEEE, vol. 92, No. 7 , pp. 1014-1020 (Jul. 2004).
Scoville, J.T., et al., "The Resistive Wall Mode Feedback Control System on DIII-D," IEEE/NPSS 18th Symposium on fusion Engineering, Albuquerque, NM, Oct. 25-29, 1999, General Atomics Report GAA23256, 7 pages (Nov. 1999).
Singleton, D.R., et al., "Compact Pulsed-Power System for Transient Plasma Ignition," IEEE Transactions on Plasma Science, vol. 37, No. 12, pp. 2275-2279 (2009) (Abstract).
Singleton, D.R., et al., "Low Energy Compact Power Modulators for Transient Plasma Ignition," IEEE Transactions on Dielectrics and Electrical Insulation, vol. 18, No. 4, pp. 1084-1090 (Aug. 2011) (Abstract).
Starikovskiy, A. and Aleksandrov, N., "Plasma-assisted ignition and combustion," Progress in Energy and Combustion Science, vol. 39, No. 1, pp. 61-110 (Feb. 2013).
Wang, F., et al., "Compact High Repetition Rate Pseudospark Pulse Generator," IEEE Transactions on Plasma Science, vol. 33, No. 4, pp. 1177-1181 (Aug. 2005) (Abstract).
Zavadtsev, D.A., et al., "Compact Electron Linear Accelerator RELUS-5 for Radiation Technology Application," 10th European Particle Accelerator Conference, Edinburgh, UK, pp. 2385-2387 (Jun. 26-30, 2006).
Zhu, Z., et al., "High Voltage pulser with a fast fall-time for plasma immersion ion implantation," Review of Scientific Instruments, vol. 82, No. 4, pp. 045102-1-045102-4 (Apr. 2011).
International Search Report and Written Opinion as issued in connection with International Patent Application No. PCT/US2014/040929, dated Sep. 15, 2014, 10 pages.
International Search Report and Written Opinion as issued in connection with International Patent Application No. PCT/US2014/065832, dated Feb. 20, 2015, 13 pages.
International Search Report and Written Opinion as issued in connection with International Patent Application No. PCT/US2015/018349, dated Jul. 14, 2015, 15 pages.
International Search Report and Written Opinion as issued in connection with International Patent Application No. PCT/US2015/040204, dated Oct. 6, 2015, 12 pages.
U.S. Non Final Office Action in U.S. Appl. No. 14/635,991, dated Jul. 29, 2016, 17 pages.
U.S. Final Office Action in U.S. Appl. No. 14/635,991, dated Jan. 23, 2017, 22 pages.
U.S. Notice of Allowance in U.S. Appl. No. 14/635,991, dated May 4, 2017, 07 pages.
U.S. Non Final Office Action in U.S. Appl. No. 15/623,464, dated Nov. 7, 2017, 18 pages.
U.S. Final Office Action in U.S. Appl. No. 15/623,464, dated Mar. 27, 2018, 18 pages.
International Search Report and Written Opinion as issued in connection with International Patent Application No. PCT/US2018/016993, dated Apr. 18, 2018, 11 pages.
International Search Report and Written Opinion as issued in connection with International Patent Application No. PCT/US2018/025440, dated Jun. 25, 2018, 25 pages.
U.S. Notice of Allowance in U.S. Appl. No. 15/623,464, dated Oct. 17, 2018, 7 pages.
U.S. Non Final Office Action in U.S. Appl. No. 15/941,731, dated Nov. 16, 2018, 17 pages.
U.S. Non Final Office Action in U.S. Appl. No. 16/178,538, dated Jan. 11, 2019, 27 pages.
U.S. Non Final Office Action in U.S. Appl. No. 16/250,765, dated Mar. 29, 2019, 11 pages.
International Search Report and Written Opinion as issued in connection with International Patent Application No. PCT/US2019/043933, dated Oct. 25, 2019, 9 pages.
International Search Report and Written Opinion as issued in connection with International Patent Application No. PCT/US2019/043932, dated Dec. 5, 2019, 16 pages.
International Search Report and Written Opinion as issued in connection with International Patent Application No. PCT/US2019/043988, dated Dec. 10, 2019, 13 pages.
U.S. Non Final Office Action in U.S. Appl. No. 16/250,157, dated Dec. 19, 2019, 6 pages.
International Search Report and Written Opinion as issued in connection with International Patent Application No. PCT/US2019/046067, dated Jan. 3, 2020, 13 pages.
International Search Report and Written Opinion dated Oct. 16, 2020 as received in PCT Application No. PCT/US2020/034427.
International Search Report and Written Opinion as issued in connection with International Patent Application No. PCT/US2020/012641, dated May 28, 2020, 15 pages.
U.S. Non Final Office Action in U.S. Appl. No. 16/697,173, dated Jun. 26, 2020, 19 pages.
U.S. Non Final Office Action in U.S. Appl. No. 16/779,270, dated Jul. 16, 2020, 9 pages.
U.S. Notice of Allowance in U.S. Appl. No. 16/779,270, dated Aug. 10, 2020, 6 pages.
U.S. Notice of Allowance in U.S. Appl. No. 16/779,270, dated Oct. 8, 2020, 5 pages.
U.S. Notice of Allowance in U.S. Appl. No. 16/697,173, dated Feb. 9, 2021, 13 pages.
International Search Report and Written Opinion as issued in connection with International Patent Application No. PCT/US2020/066990, dated May 5, 2021, 9 pages.
U.S. Notice of Allowance in U.S. Appl. No. 16/523,840, dated Sep. 30, 2020, 9 pgs.
U.S. Non-Final Office Action in U.S. Appl. No. 14/542,487 dated Nov. 23, 2015, 11 pages.
U.S. Non-Final Office Action in U.S. Appl. No. 14/798,154 dated Jan. 5, 2016, 13 pages.
U.S. Final Office Action in U.S. Appl. No. 14/542,487 dated Feb. 12, 2016, 11 pages.
U.S. Non-Final Office Action in U.S. Appl. No. 14/542,487 dated Apr. 8, 2016, 12 pages.
U.S. Final Office Action in U.S. Appl. No. 14/798,154 dated Oct. 6, 2016, 14 pages.
U.S. Final Office Action in U.S. Appl. No. 14/542,487 dated Dec. 12, 2016, 13 pages.
U.S. Non-Final Office Action in U.S. Appl. No. 14/798,154 dated May 26, 2017, 16 pages.
U.S. Non-Final Office Action in U.S. Appl. No. 14/542,487 dated Jun. 5, 2017, 12 pages.
Partial Supplementary European Search Report received Jul. 28, 2017 in related foreign application No. 14861818.4, 12 Pages.
U.S. Final Office Action in U.S. Appl. No. 14/542,487 dated Dec. 19, 2017, 07 pages.
U.S. Final Office Action in U.S. Appl. No. 14/798,154 dated Dec. 28, 2017, 06 pages.
U.S. Notice of Allowance in U.S. Appl. No. 14/542,487 dated Mar. 21, 2018, 05 pages.
U.S. Notice of Allowance in U.S. Appl. No. 14/798,154 dated Jun. 1, 2018, 05 pages.
U.S. Non-Final Office Action in U.S. Appl. No. 15/921,650 dated Nov. 28, 2018, 11 pages.
U.S. Notice of Allowance in U.S. Appl. No. 15/921,650 dated Apr. 4, 2019, 7 pages.
U.S. Non Final Office Action in U.S. Appl. No. 16/178,565, dated Apr. 4, 2019, 10 pages.
U.S. Final Office Action in U.S. Appl. No. 16/178,565, dated Jul. 12, 2019, 11 pages.
U.S. Notice of Allowance in U.S. Appl. No. 16/178,565, dated Nov. 14, 2019, 5 pages.
U.S. Notice of Allowance in U.S. Appl. No. 16/525,357, dated Jan. 14, 2020, 8 pages.

(56) References Cited

OTHER PUBLICATIONS

U.S. Non-Final Office Action in U.S. Appl. No. 16/523,840, dated Mar. 19, 2020, 6 pages.
International Search Report and Written Opinion as issued in connection with International Patent Application No. PCT/US2019/013988, dated Apr. 9, 2020, 4 pages.
U.S. Notice of Allowance in U.S. Appl. No. 16/250,157 dated Apr. 13, 2020, 8 pages.
U.S. Non-Final Office Action in U.S. Appl. No. 16/524,950, dated Apr. 16, 2020, 8 pages.
U.S. Restriction Requirement in U.S. Appl. No. 16/524,967, dated Apr. 29, 2020, 6 pages.
U.S. Non-Final Office Action in U.S. Appl. No. 16/722,115, dated May 14, 2020, 6 pages.
U.S. Final Office Action in U.S. Appl. No. 16/523,840, dated Jun. 26, 2020, 5 pages.
U.S. Notice of Allowance in U.S. Appl. No. 16/524,967, dated Jul. 17, 2020, 11 pages.
U.S. Notice of Allowance in U.S. Appl. No. 16/524,950, dated Oct. 19, 2020, 9 pages.
U.S. Notice of Allowance in U.S. Appl. No. 16/524,950, dated Nov. 16, 2020, 9 pages.
U.S. Final Office Action in U.S. Appl. No. 16/722,115, dated Dec. 2, 2020, 7 pages.
U.S. Notice of Allowance in U.S. Appl. No. 16/523,840, dated Dec. 4, 2020, 11 pages.
U.S. Notice of Allowance in U.S. Appl. No. 16/524,926, dated Jan. 15, 2021, 9 pages.
U.S. Notice of Allowance in U.S. Appl. No. 16/848,830, dated Feb. 19, 2021, 8 pages.
U.S. Notice of Allowance in U.S. Appl. No. 16/722,115, dated Apr. 1, 2021, 9 pages.
U.S. Notice of Allowance in U.S. Appl. No. 16/721,396, dated Apr. 23, 2021, 10 pages.
U.S. Non-Final Office Action in U.S. Appl. No. 16/722,115, dated May 3, 2021, 9 pages.
U.S. Notice of Allowance in U.S. Appl. No. 16/848,830, dated May 13, 2021, 6 pages.
International Search Report and Written Opinion dated Sep. 30, 2020 as received in PCT Application No. PCT/US2020/040579.
Pustylnik et al. High Voltage Nanosecond Pulses in a Low-Pressure Radiofrequency Discharge, Physical Review E87 (063105), 2013. [Retrieved on Oct. 9, 2020], Retrieved from the internet. <URL: https://arxiv.org/abs/1302.6408.pdf> entire document.
International Search Report and written opinion received for PCT Patent Application No. PCT/US2020/60799, dated Feb. 5, 2021, 11 pages.
International Preliminary Report On Patentability dated Aug. 12, 2021 in PCT Application No. PCT/US2020/016253, 07 pages.
Notice of Reason for Refusal for JP Patent Application No. 2021-504454, dated Jul. 20, 2021, 8 pages.
Non-Final Office Action in U.S. Appl. No. 16/937,948, dated Aug. 24, 2021, 10 pages.
Restriction Requirement in U.S. Appl. No. 17/133,612, dated Aug. 26, 2021, 5 pages.

\* cited by examiner

PLASMA SHEATH CONTROL FOR RF PLASMA REACTORS

CROSS-REFERENCE TO RELATED APPLICATIONS

This application claims priority to U.S. Provisional Patent Application No. 62/717,523 filed Aug. 10, 2018, titled "PLASMA SHEATH CONTROL FOR RF PLASMA REACTORS," which is incorporated by reference in its entirety.

This application claims priority to U.S. Provisional Patent Application No. 62/774,078 filed Nov. 30, 2018, titled "VARIABLE OUTPUT IMPEDANCE RF GENERATOR," which is incorporated by reference in its entirety.

This application claims priority to U.S. Provisional Patent Application No. 62/789,523 filed Jan. 8, 2019, titled "EFFICIENT ENERGY RECOVERY IN A NANOSECOND PULSER CIRCUIT," which is incorporated by reference in its entirety.

This application claims priority to U.S. Provisional Patent Application No. 62/789,526 filed Jan. 8, 2019, titled "EFFICIENT NANOSECOND PULSER WITH SOURCE AND SINK CAPABILITY FOR PLASMA CONTROL APPLICATIONS," which is incorporated by reference in its entirety.

BACKGROUND

The application of RF-excited gaseous discharges in thin film fabrication technology has become standard. The simplest geometry most commonly used is that of two planar electrodes between which a voltage is applied. A schematic representation of such a planar RF plasma reactor is shown in FIG. 1. The plasma is separated from each electrode by a plasma sheath.

Positive ions produced in the plasma volume are accelerated across the plasma sheaths and arrive at the electrodes with an Ion Energy Distribution Function (IEDF) which is determined by the magnitude and the waveform of the time dependent potential difference across the sheaths, the gas pressure, the physical geometry of the reactor, and/or other factors. This ion bombardment energy distribution may determine the degree of anisotropy in thin-film etching amount of ion impact induced damage to surfaces, etc.

SUMMARY

Some embodiments include a plasma sheath control system that includes an RF power supply producing an RF sinusoidal waveform with a frequency greater than 20 kHz and a peak voltage greater than 1 kV and a plasma chamber electrically coupled with the RF power supply, the plasma chamber having a plurality of ions that are accelerated into a surface disposed with energies greater than about 1 kV, and the plasma chamber produces a plasma sheath within the plasma chamber from the RF sinusoidal waveform. The plasma sheath control system includes a blocking diode electrically connected between the RF power supply and the plasma chamber and a capacitive discharge circuit electrically coupled with the RF power supply, the plasma chamber, and the blocking diode; the capacitive discharge circuit discharges capacitive charges within the plasma chamber with a peak voltage greater than 1 kV and a discharge time that less than 250 nanoseconds.

In some embodiments, the capacitive discharge circuit comprises a resistive output stage comprising a resistor and an inductor arranged in series, the resistive output stage disposed between a point on the plasma sheath control system between the blocking diode and the plasma chamber and ground.

In some embodiments, the capacitive discharge circuit comprises an energy recovery circuit comprising a diode and an inductor arranged in series, the energy recovery circuit disposed between the blocking diode and the plasma chamber and the RF power supply.

In some embodiments, the plasma sheath control system may include a bias capacitor disposed in series between the blocking diode and the plasma chamber. In some embodiments, the plasma sheath control system may include a bias compensation circuit comprising a DC power supply, a resistor, diode, and a high voltage switch, the bias compensation circuit disposed between a point on the plasma sheath control system between the blocking diode and the RF power supply.

In some embodiments, the plasma sheath control system may include a matching network electrically coupled with the plasma chamber that matches a reactive impedance of a plasma load within the plasma chamber to an output impedance of the RF power supply.

In some embodiments, the blocking diode rectifies the sinusoidal waveform creating an sinusoidal waveform with a substantially flat portion for at least 25% of each period.

Some embodiments include a plasma sheath control system. The plasma sheath control system may include a high voltage DC power supply that produces a DC voltage greater than 200 V. The plasma sheath control system may include a resonant circuit driver comprising a plurality of high voltage switches coupled with a resonant load that alternately switch on and off to produce a sinusoidal waveform with a frequency greater than 20 kHz and a peak voltage greater than 1 kV. The plasma sheath control system may include a plasma chamber electrically coupled with the resonant circuit driver, the plasma chamber having a plurality of ions that are accelerated into a surface disposed within the plasma chamber with energies greater than about 1 kV, and the plasma chamber produces a plasma sheath within the plasma chamber from the sinusoidal waveform. The plasma sheath control system may include a blocking diode electrically connected between the resonant circuit driver and the plasma chamber that rectifies the sinusoidal waveform.

In some embodiments, the blocking diode rectifies the sinusoidal waveform creating a waveform with a substantially flat portion for at least 25% of each period.

In some embodiments, the plasma sheath control system may include a resistive output stage including a resistor and an inductor arranged in series, the resistive output stage disposed between a point on the plasma sheath control system between the blocking diode and the plasma chamber and ground.

In some embodiments, the plasma sheath control system may include an energy recovery circuit including a diode and an inductor arranged in series, the energy recovery circuit disposed between the blocking diode and the plasma chamber and the high voltage DC power supply.

In some embodiments, the plurality of switches comprises a first switch, a second switch, a third switch, and a fourth switch. In some embodiments, the first switch and the fourth switch are closed during a first time period to allow current to flow in a first direction; and the second switch and the third switch are closed during a second time period to allow current to flow in a second direction that is opposite the first direction.

In some embodiments, the plurality of switches comprises a first switch and a second switch. In some embodiments, the first switch is closed during a first time period to allow current to flow in a first direction; and the second switch is closed during a second time period to allow current to flow in a second direction that is opposite the first direction.

In some embodiments, the plurality of switches are switched at a frequency according to:

$$f \approx \frac{1}{2\pi\sqrt{(L)(C)}},$$

where f is greater than 10 kHz, where L represents the inductance of a load within the plasma chamber, and C represents the capacitance of a capacitor within the resonant circuit driver.

In some embodiments, the plurality of switches are switched at a frequency according to:

$$f \approx \frac{1}{2\pi\sqrt{(L)(C)}},$$

where f is greater than 10 kHz, where L represents the inductance of an inductor within the resonant circuit driver, and C represents the capacitance of the load with the plasma chamber.

In some embodiments, the plurality of switches are switched at a frequency according to:

$$f \approx \frac{1}{2\pi\sqrt{(L)(C)}},$$

where f is greater than 10 kHz, where L represents the inductance of an inductor within the resonant circuit driver, and C represents the capacitance of capacitor within the resonant circuit driver.

In some embodiments, the plasma sheath control system produces a voltage across the plasma sheath that is greater than about 1 kV while the resonant circuit driver is producing the sinusoidal waveform.

In some embodiments, the plasma sheath control system may include a controller that adjusts either or both the frequency or the power of the sinusoidal waveform produced by the resonant circuit on time scales less than about 1 ms.

In some embodiments, the plasma sheath control system may include a controller that measures a frequency of a sinusoidal waveform at a point prior to the plasma chamber and adjusts the frequency of the sinusoidal waveform produced by the resonant circuit driver if the frequency of the sinusoidal waveform at the point prior to the plasma chamber does not match a resonant frequency.

In some embodiments, the plasma sheath control system may include a controller that measures a power of a sinusoidal waveform at a point prior to the plasma chamber and adjusts the power of the sinusoidal waveform produced by the resonant circuit driver if the power of the sinusoidal waveform at the point prior to the plasma chamber does not match a required power.

Some embodiments of the invention include a plasma sheath control system comprising: an RF power supply producing high voltage and high frequency sinusoidal waveforms; a resistive output stage comprising a resistor and an inductor; and a blocking diode disposed between the RF power supply and the resistive output stage. In some embodiments, a plasma reactor may be included that may, for example, include gas feed systems, control systems, plasma generation systems, vacuum pumping, wafer transport systems, etc. In some embodiments, the resistive output stage has a capacitance less than about 200 pF. In some embodiments, the plasma sheath control system further comprises an output configured to couple with a wafer deposition device. In some embodiments, the plasma sheath control system further comprises an output configured to output high voltage sinusoidal waveforms with an amplitude greater than 2 kV and a frequency greater than 1 kHz.

Some embodiments of the invention include an plasma sheath control system comprising: an RF power supply; a bias capacitor; and a high voltage switch coupled across the blocking diode, wherein the high voltage switch is off when the high voltage switching power supply is turned on, and the high voltage switch is on when the high voltage switching power supply is not pulsing. In some embodiments, the plasma sheath control system further comprises an output configured to couple with a wafer deposition device. In some embodiments, the plasma sheath control system further comprises an output configured to output high voltage sinusoidal waveforms with an amplitude greater than 2 kV and a frequency greater than 1 kHz.

Some embodiments of the invention include a plasma sheath control system producing an output that creates a plasma within a wafer deposition chamber such that the voltage potential between the wafer and a chuck is about 2 kV during periods when plasma sheath control system is turned on and when plasma sheath control system is turned off.

In some embodiments, the resistive output stage may include a series or parallel network of passive components. For example, the resistive output stage may include a series of a resistor, a capacitor, and an inductor. As another example, the resistive output stage may include a capacitor in parallel with an inductor and the capacitor-inductor combination in series with a resistor. Regardless of the arrangement, the component values may be selected to match the RF frequency of the RF source.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

A plasma sheath control system is disclosed that includes either or both a diode and a capacitive discharge circuit (e.g., a resistive output stage or an energy recovery circuit) and/or a high voltage switch with a blocking diode. In some embodiments, the plasma sheath control circuit can include a RF bias power supply with a plasma chamber to fabricate semiconductors or similar devices. In some embodiments, a plasma sheath control circuit can produce an output that creates a plasma within a semiconductor fabrication device. For example, such that a more controllable and constant plasma sheath potential can be produced between the plasma and a target electrode or wafer. The enhanced control may allow for a peaked and/or adjustable Ion Energy Distribution of the bombarding ions from the plasma, which may, for example, result in higher application performance such as, for example, in etching, thin film deposition, ion deposition, solar panel, and/or display panel fabrication etc. Additionally or alternatively, a roughly constant voltage potential between the wafer and a chuck may be maintained at approximately 2 kV during periods when the plasma sheath control circuit is turned on and when the plasma sheath control circuit is turned off. In some embodiments, the RF power supply system can produce sinusoidal waveform with peak amplitudes greater than about 1 kV-10 kV.

Figure 1:
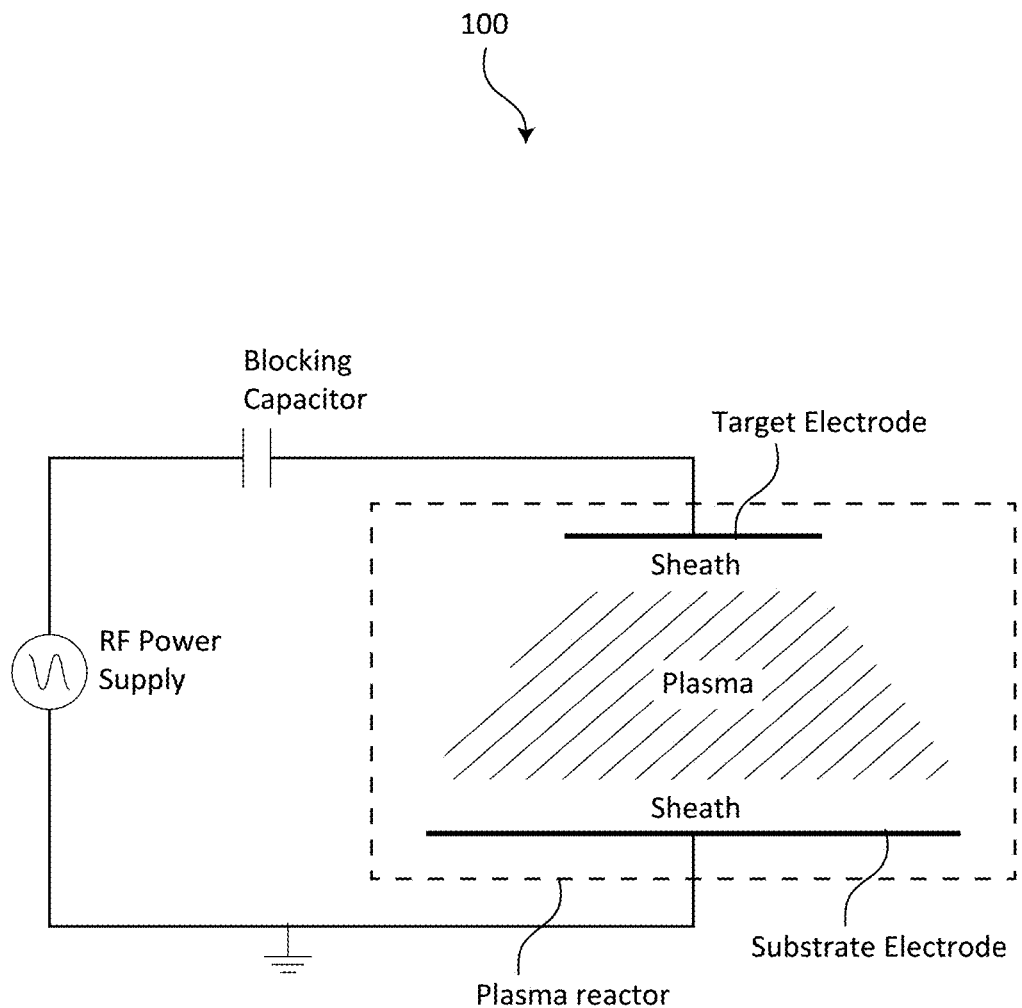
FIG. 1 is a schematic representation of an RF plasma reactor according to some embodiments.
Figure 2:
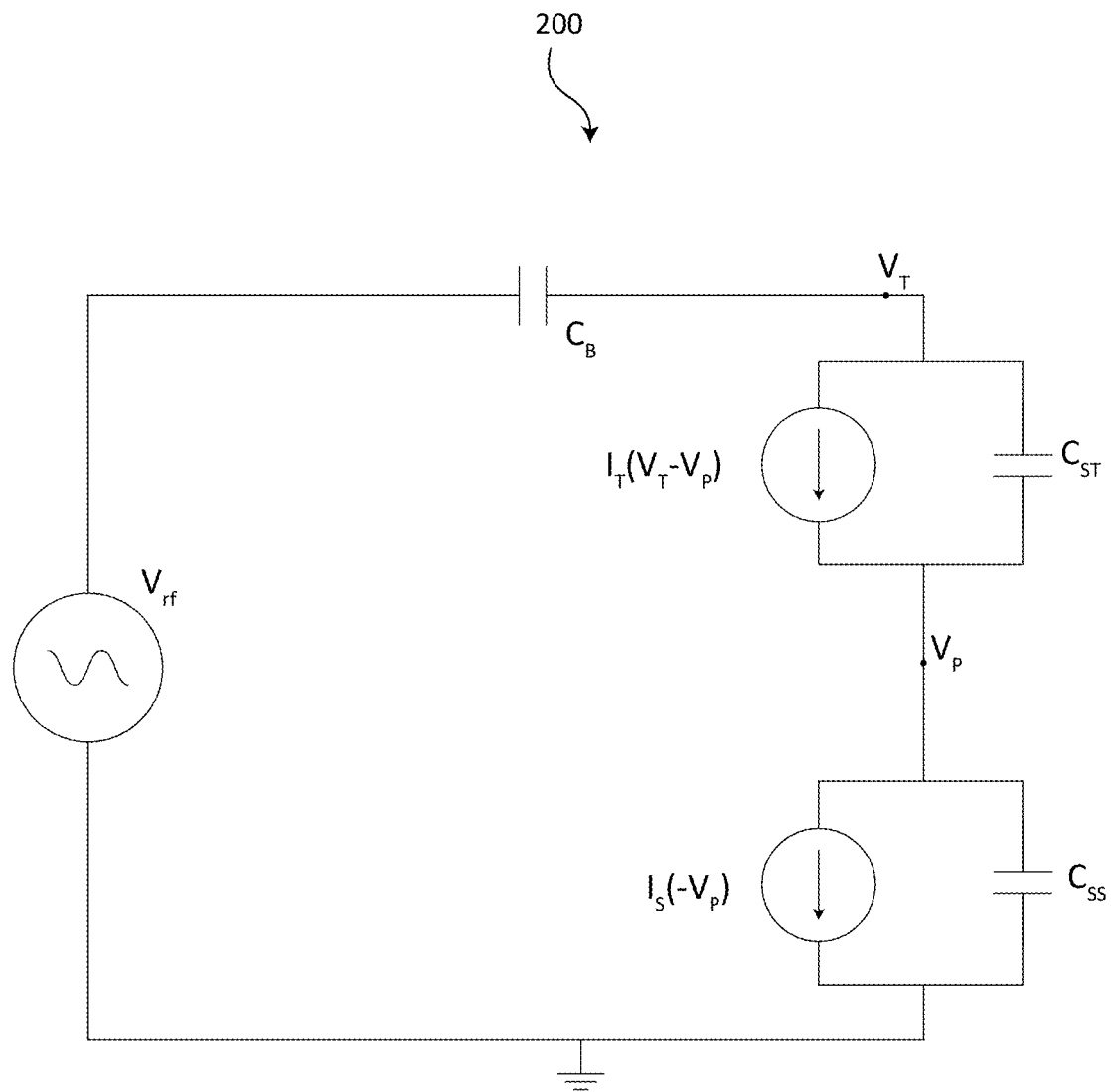
FIG. 2 is schematic of the RF driver for an RF plasma chamber according to some embodiments.

FIG. 2 is schematic of an RF driver of an RF plasma power supply and reactor. Here, $V_{RF}$ is the voltage of the applied Sinusoidal waveform from a matched RF power supply. $V_T$ and $V_P$ are the potentials of the target electrode and the plasma, respectively. In addition, $V_{SS}=V_P$ and $V_{ST}=V_T-V_P$ are the voltages across the substrate or chamber wall plasma sheath and the target plasma sheath, respectively. The blocking capacitor is represented by $C_B$; $C_{ST}$ and $I_T$ represent the capacitance of and conduction current through the sheath adjacent to the target electrode, respectively, while $C_{ss}$ and $I_S$ represent the corresponding values for the sheath adjacent to the substrate electrode.

The electrical resistance of the plasma is small with respect to the sheath resistance for the plasma electron densities and voltage frequency range considered in the present discussion. However, inclusion of the plasma resistance does not introduce any complications for the circuit model.

Figure 3:
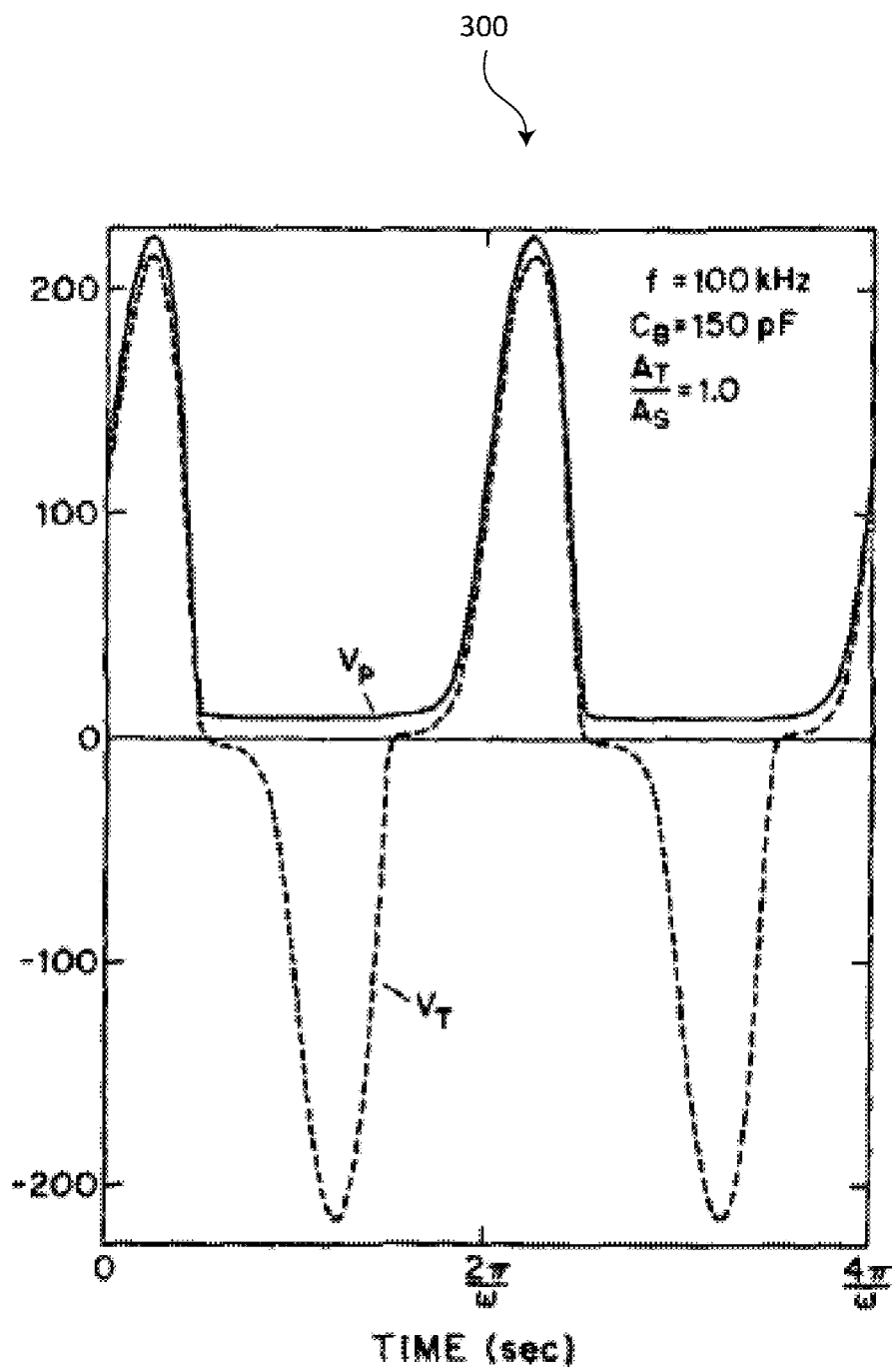
FIG. 3. illustrates waveforms of the voltage $V_r$ across a plasma chamber and the plasma potential $V_P$ for equal areas of the target and substrate electrodes.

FIG. 3. Illustrates waveforms of the voltage $V_r$ across the plasma reactor and the plasma potential $V_P$ for equal areas of the target and substrate electrodes.

Figure 4:
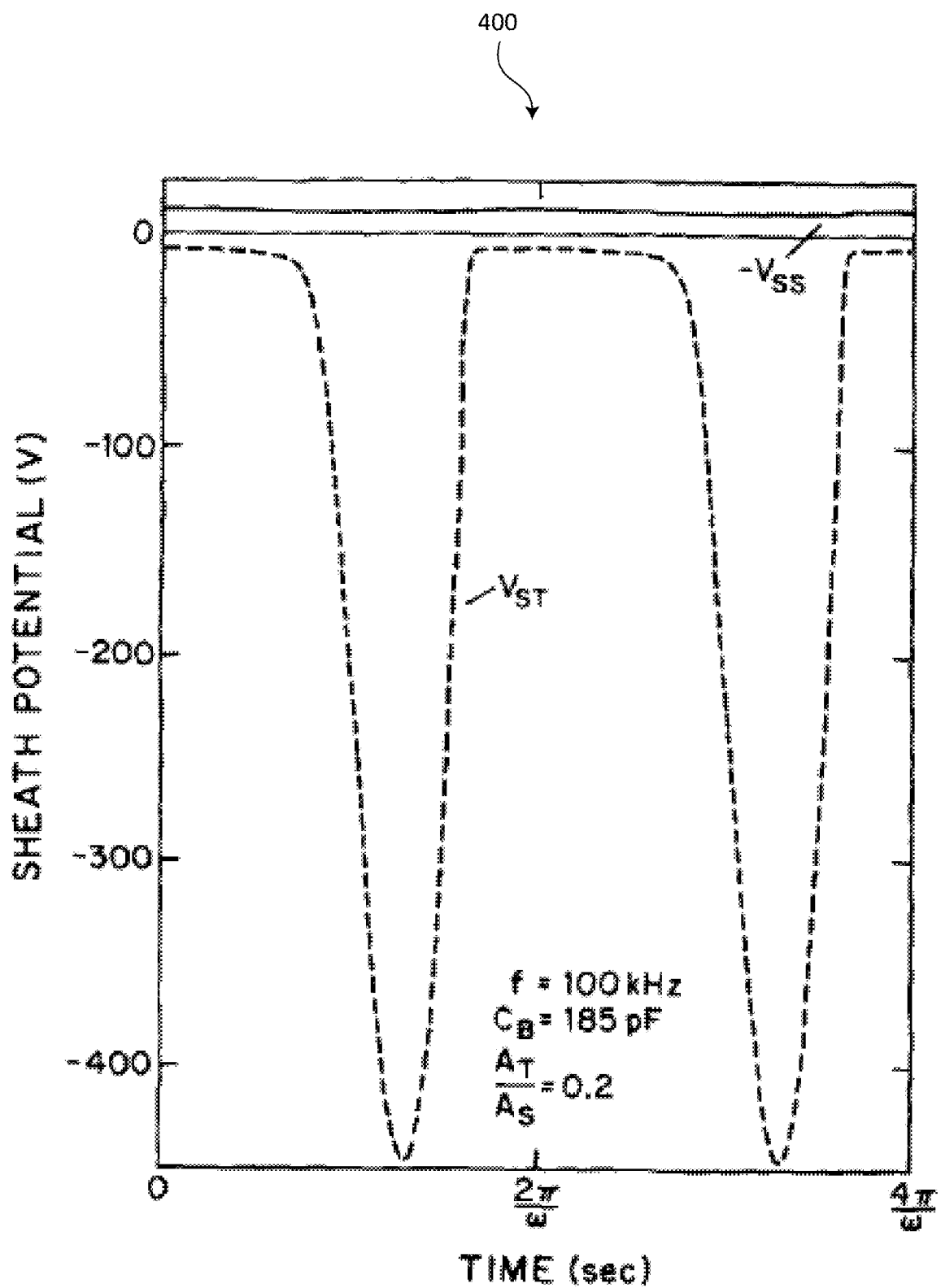
FIG. 4 illustrates waveforms of the potential $V_{ST}$ across a plasma sheath adjacent to the target electrode within a plasma chamber and that of the potential $V_{ss}$ across the sub-strate electrode.

FIG. 4 Illustrates waveforms of the potential $V_{ST}$ across the plasma sheath adjacent to the target electrode and that of the potential $V_{ss}$ across the sub-strate electrode sheath for $A_T/A_S=0.2$. FIG. 4 shows the half sine wave of the sheath potential going from 0 to −450V.

Figure 5:
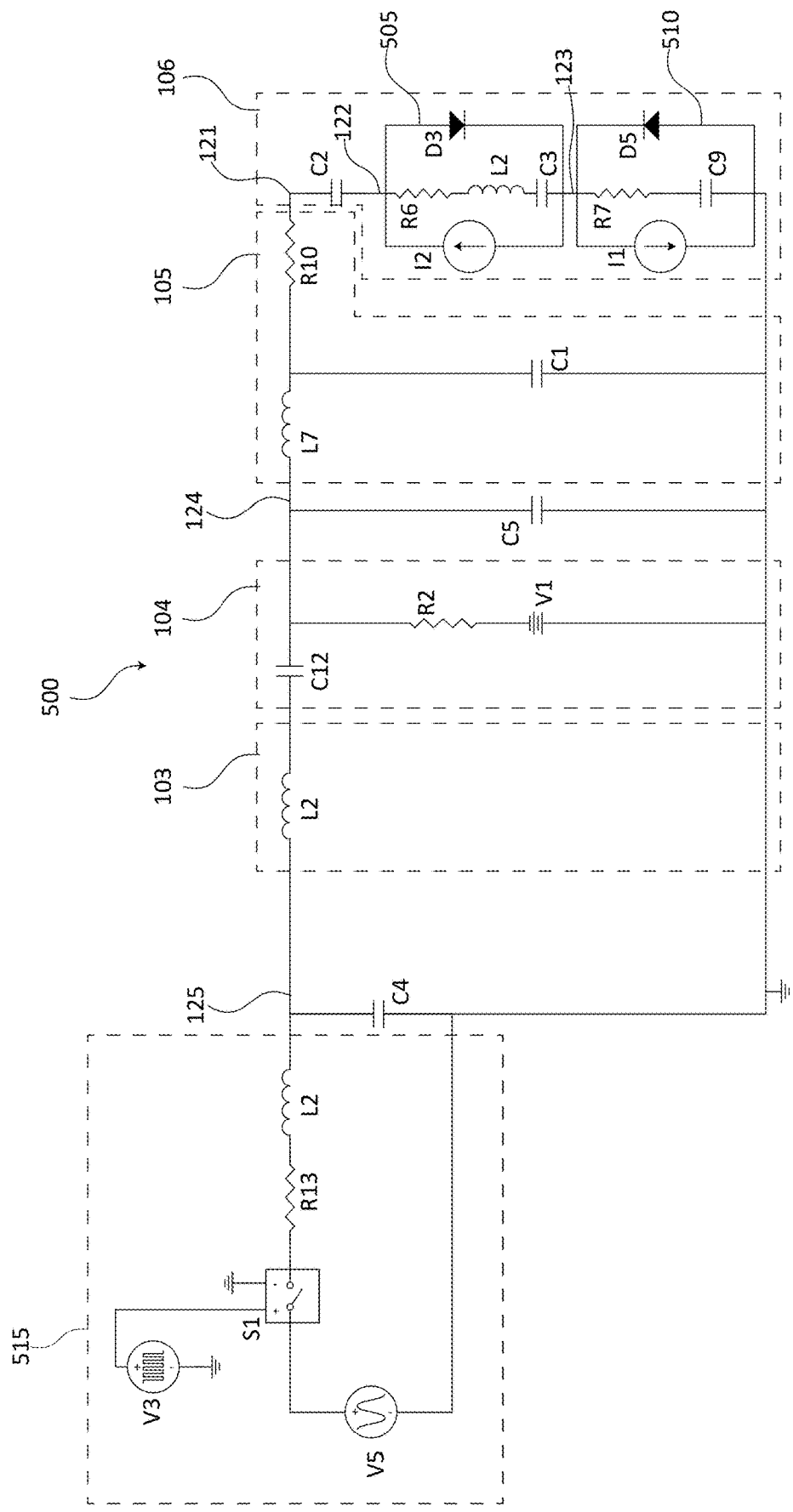
FIG. 5 is a schematic of an plasma sheath control system for an RF chamber according to some embodiments.

FIG. 5 is a schematic of an plasma sheath control system 500 for an RF chamber according to some embodiments. The plasma sheath control system 500 includes a circuit representing the wafer plasma sheath 505 developed on the wafer and a circuit representing the wall plasma sheath 510 on the wall of the plasma chamber. Capacitor C3 represents the sheath capacitance between plasma and the wafer, which may be function of both physical geometry and plasma parameters across the sheath. Capacitor C9 represents the sheath capacitance between plasma and the plasma chamber wall, which may be function of both physical geometry and plasma parameters across the sheath RF power source V5 is the RF voltage supply which provides a high voltage Sinusoidal waveform. Switch S2 can be used to turn on and turn off the RF power source V5, which may be an element for modeling the turning off and on of the RF power source V5. The various other components represent stray capacitance, inductance, and/or resistance.

In some embodiments, the lead stage 103 may represent either or both the leads or traces between the RF generator 515 and the DC bias circuit 104. Either or both the inductor L2 or the inductor L6 may represent the inductance with either or both the leads or traces.

In this example, the DC bias circuit 104 does not include any bias compensation. The DC bias circuit 104 includes an offset supply voltage V1 that may, for example, bias the output voltage either positively or negatively. In some embodiments, the offset supply voltage V1, can be adjusted to change the offset between the wafer voltage and the chuck voltage. In some embodiments, offset supply voltage V1 can have a voltage of about ±5 kV, ±4 kV, ±3 kV, ±2, kV, ±1 kV, etc. kV.

In some embodiments, the bias capacitor C12 can isolate (or separate) the DC bias voltage from either or both the resistive output stage or other circuit elements. The bias capacitor C12, for example, may allow for a potential shift from one portion of the circuit to another. In some embodiments, this potential shift may ensure that the electrostatic force holding the wafer in place on the chuck remains below the voltage threshold. The resistor R2 may isolate the DC bias supply from the high voltage sinusoidal waveform output from the RF generator 515.

The bias capacitor C12, for example, 100 pF, 10 pF, 1 pF, 100 µF, 10 µF, 1 µF, etc. The resistor R2, for example, may have a high resistance such as, for example, a resistance of about 1 kOhm, 10 kOhm, 100 kOhm, 1 MOhm, 10 MOhm, 100 MOhm, etc.

The second lead stage 105 represents circuit elements between the RF power circuit and the load stage 106. The resistor R13, for example, may represent the stray resistance of the leads or transmission lines that connect from the output of the high voltage power system to the electrode (e.g., the load stage 106). The capacitors C1, for example, may represent stray capacitance in the leads or transmissions line.

In some embodiments, the load stage 106 may represent an idealized or effective circuit for semiconductor processing chamber such as, for example, a plasma deposition system, semiconductor fabrication system, plasma sputtering system, etc. The capacitance C2, for example, may represent the capacitance of the chuck upon which the wafer may sit. The chuck, for example, may comprise a dielectric material. For example, the capacitor C1 may have small capacitance (e.g., about 10 pF, 100 pF, 500 pF, 1 nF, 10 nF, 100 nF, etc.).

The capacitor C3, for example, may represent the sheath capacitance between the plasma and the wafer. The resistor R6, for example, may represent the sheath resistance between the plasma and the wafer. The inductor L2, for example, may represent the sheath inductance between the plasma and the wafer. The current source 12, for example, may be represent the ion current through the sheath. For example, the capacitor C1 or the capacitor C3 may have small capacitance (e.g., about 10 pF, 100 pF, 500 pF, 1 nF, 10 nF, 100 nF, etc.).

The capacitor C9, for example, may represent capacitance within the plasma between a chamber wall and the plasma. The resistor R7, for example, may represent resistance within the plasma between a chamber wall and the top surface of the wafer. The current source I1, for example, may be representative of the ion current in the plasma. For example, the capacitor C1 or the capacitor C9 may have small capacitance (e.g., about 10 pF, 100 pF, 500 pF, 1 nF, 10 nF, 100 nF, etc.).

As used in this document the plasma voltage is the voltage measured from ground to circuit point 123; the wafer voltage is the voltage measured from ground to circuit point 122 and may represent the voltage at the surface of the wafer; the chucking voltage is the voltage measured from ground to circuit point 121 to point 122; the electrode voltage is the voltage measure from ground to circuit point 121 and ground; and the input voltage is the voltage measured from ground to circuit point 125.

Figure 6:
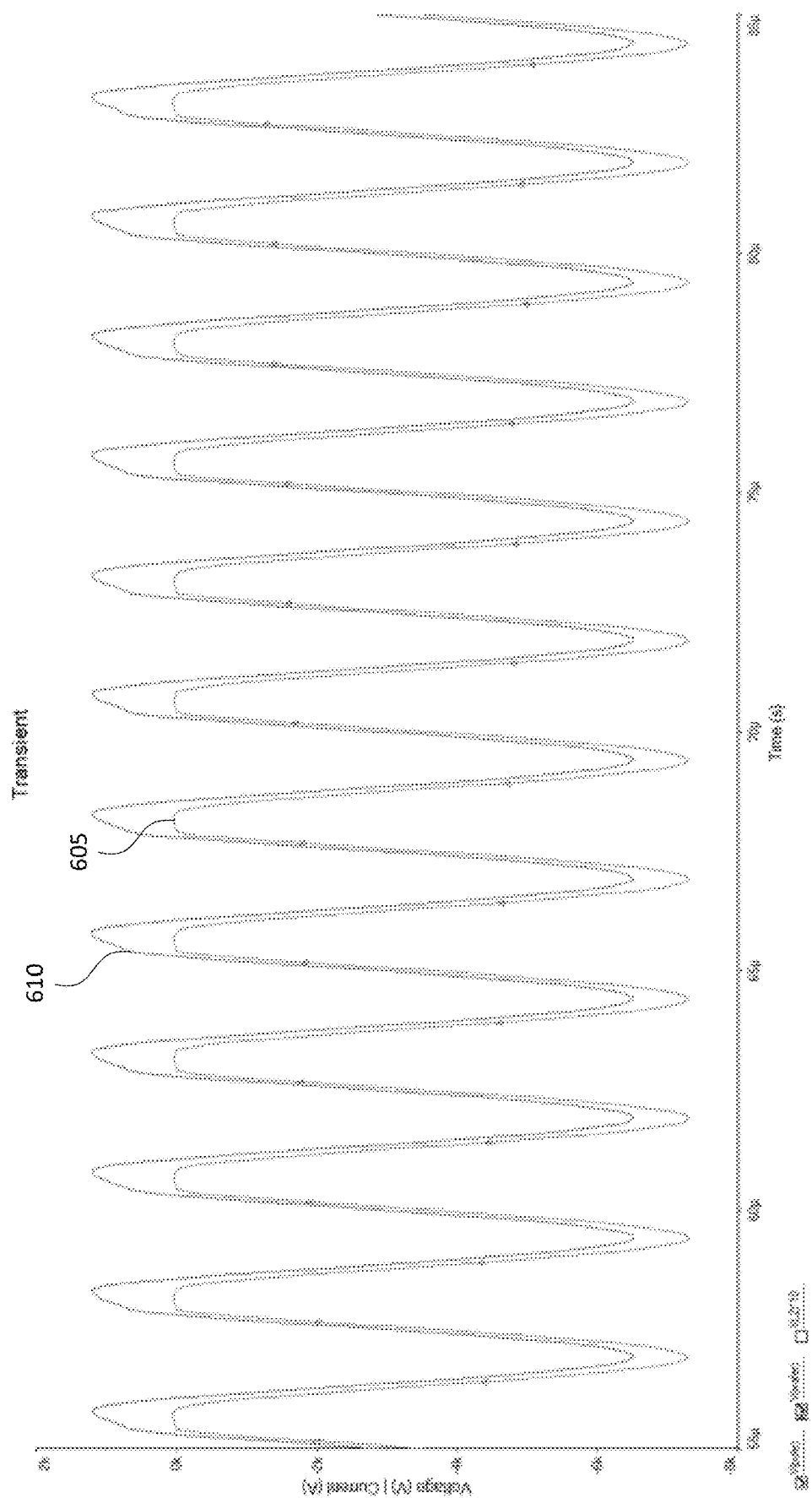
FIG. 6 illustrates waveforms across the sheath (e.g., C3) and at the chuck (e.g., C2).

FIG. 6 illustrates waveforms across the sheath (e.g., across the capacitor C3), which is between circuit point 122 and circuit point 123, and at the chuck (e.g., across the capacitor C2), which is circuit point 121. Waveform 605 shows the voltage across the plasma sheath (e.g., the wafer plasma sheath 505 and/or the wall plasma sheath 510). Waveform 605 is a pure sine wave that is slightly clipped at zero because of the of the diode (D3), which is part of the plasma effect. Waveform 610 shows the voltage at the electrode (or across the chuck). In some embodiments, the difference between the chucking voltage and the wafer voltage (e.g., the difference between waveforms) can be kept around 2 kV or slightly less. At turn off this difference returns to −2 kV. A difference of about 2 kV may be sufficient to electrostatically couple a wafer to a chuck and a difference greater than 2 kV may do so while being destructive to a wafer.

Figure 7:
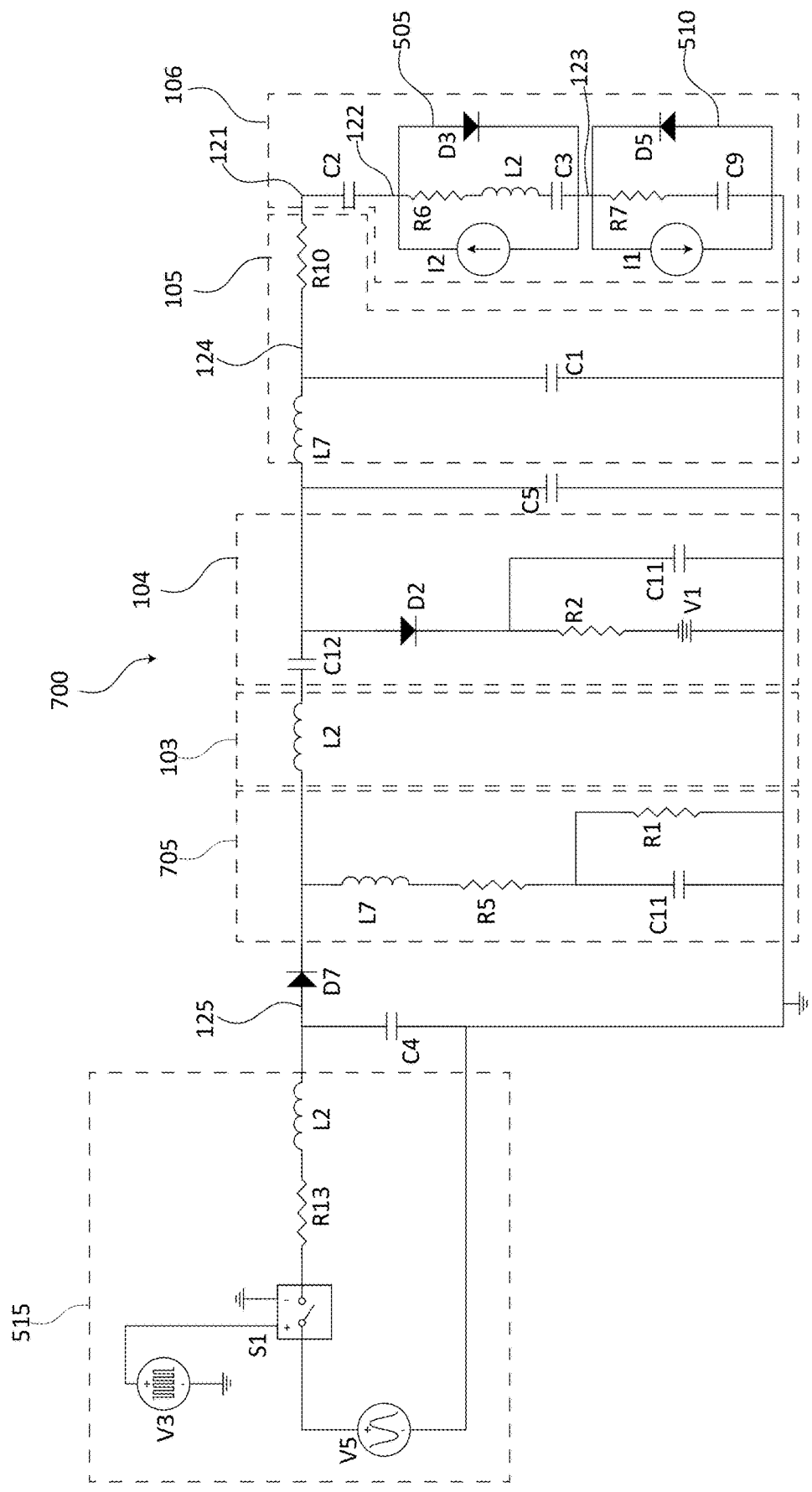
FIG. 7 is another schematic of an plasma sheath control system for an RF chamber with a resistive output stage according to some embodiments.
Figure 9:
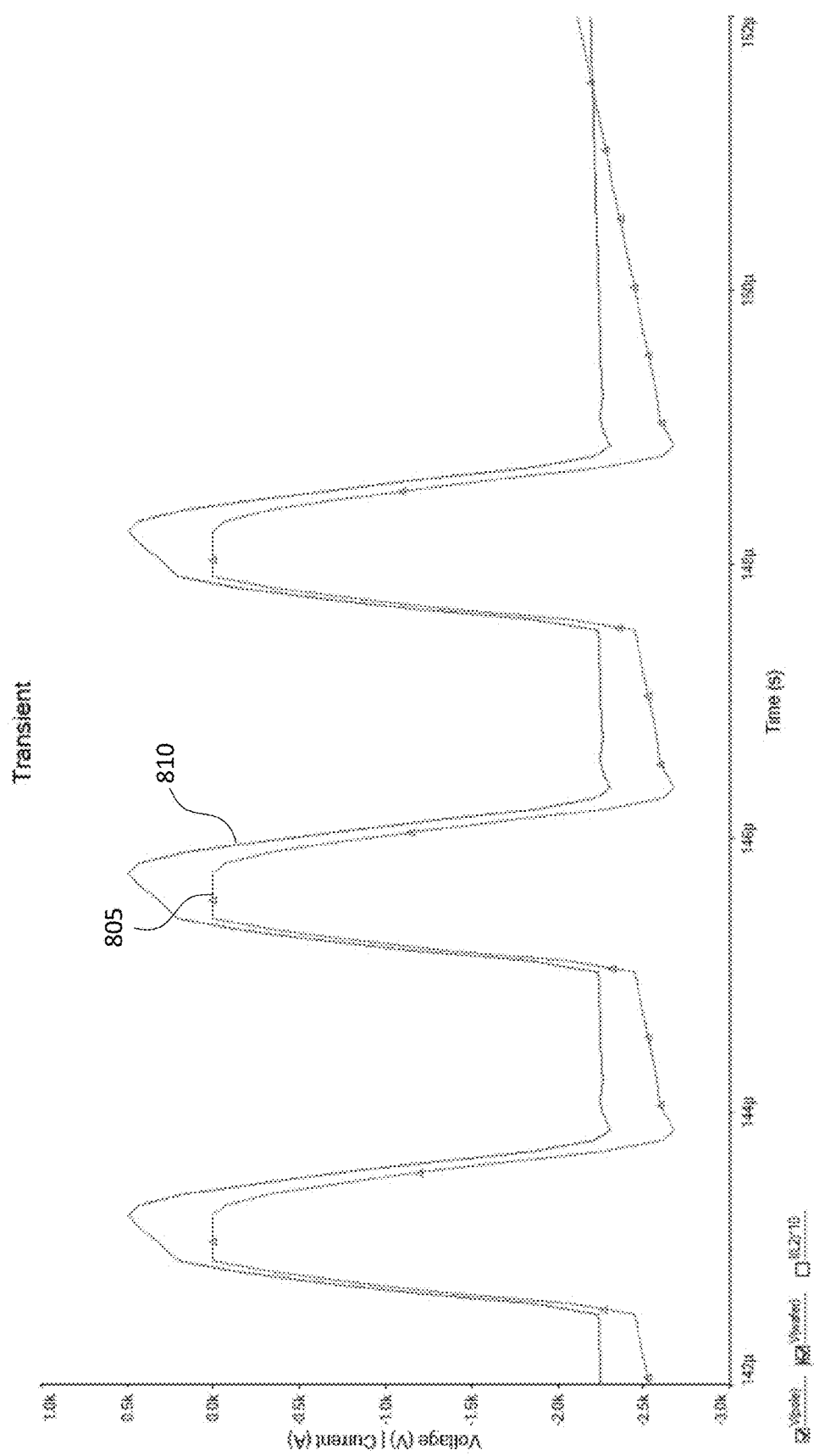
FIG. 9 is a zoomed in view of three cycles of the waveform shown in FIG. 8.

FIG. 7 is another schematic of a plasma sheath control system 700 of an RF plasma reactor with a resistive output stage 705 according to some embodiments. In this example, the plasma sheath control system 700 includes blocking diode D7. The blocking diode D7 may rectify Sinusoidal waveforms that may, for example, produce a flat top on each sinusoidal waveform as shown in FIG. 9. The blocking diode D7, for example, may rectify the Sinusoidal waveform creating an Sinusoidal waveform with a substantially flat portion for at least 10%, 15%, 20%, 25%, 30%, etc. of each period.

The resistive output stage 705 may include one or more inductors L1 and one or more resistors R1. The resistive output stage 705 may include any type of resistive output stage such as, for example, a resistive output stage described in U.S. patent application Ser. No. 15/941,731 entitled "HIGH VOLTAGE RESISTIVE OUTPUT STAGE CIRCUIT", which is incorporated by reference in its entirety for all purposes.

In some embodiments, the resistor R1 may have a resistance less than about 500 ohms, 200 ohms, 100 ohms, etc.

In some embodiments, the resistive output stage 705 may be electrically coupled in parallel with the load stage 106 (e.g., plasma chamber) and the high voltage switching power supply. In some embodiments, the resistive output stage may include at least one resistor (e.g., R1) that discharges a load (e.g., from the wafer plasma sheath or the wall plasma sheath 510). In some embodiments, the resistive output stage may be configured to discharge over about 1 kilowatt of average power during each sinusoidal waveform cycle and/or a joule or less of energy in each sinusoidal waveform cycle. In some embodiments, the resistance of the resistor R1 in the resistive output stage may be less than 200 ohms. In some embodiments, the resistor R1 may comprise a plurality of resistors arranged in series or parallel having a combined capacitance less than about 200 pF (e.g., C11).

In some embodiments, the resistive output stage 705 may include a collection of circuit elements that can be used to control the shape of a voltage waveform on a load. In some embodiments, the resistive output stage 705 may include passive elements only (e.g., resistors, capacitors, inductors, etc.). In some embodiments, the resistive output stage 705 may include active circuit elements (e.g., switches) as well as passive circuit elements. In some embodiments, the resistive output stage 705, for example, can be used to control the voltage rise time of a waveform and/or the voltage fall time of waveform.

In some embodiments, the resistive output stage 705 can discharge capacitive loads (e.g., the capacitive charge from the wafer plasma sheath 505 and/or the wall plasma sheath 510). For example, these capacitive loads may have small capacitance (e.g., about 10 pF, 100 pF, 500 pF, 1 nF, 10 nF, 100 nF, etc.).

In some embodiments, a resistive output stage can be used in circuits with sinusoidal waveforms having a high peak voltage (e.g., voltages greater than 1 kV, 10 kV, 20 kV, 50 kV, 100 kV, etc.) and/or high frequencies (e.g., frequencies greater than 1 kHz, 10 kHz, 100 kHz, 200 kHz, 500 kHz, 1 MHz, etc.).

In some embodiments, the resistive output stage 705 may be selected to handle high average power, high peak power, fast rise times and/or fast fall times. For example, the average power rating might be greater than about 0.5 kW, 1.0 kW, 10 kW, 25 kW, etc., and/or the peak power rating might be greater than about 1 kW, 10 kW, 100 kW, 1 MW, etc.

In some embodiments, the resistive output stage 705 may include a series or parallel network of passive components. For example, the resistive output stage 705 may include a series of a resistor R5, a capacitor C11, and an inductor L7. As another example, the resistive output stage 705 may include a capacitor in parallel with an inductor and the capacitor-inductor combination in series with a resistor. Regardless of the arrangement, the component values may be selected to match the RF frequency of the RF source. The blocking diode D7 may rectify the output of RF generator 515. For example, the blocking diode D7 may rectify the Sinusoidal waveform creating an Sinusoidal waveform with a substantially flat portion for at least 10%, 15%, 20%, 25%, 30%, etc. of each period.

In some embodiments, the resistive output stage 705 may rapidly discharge a high voltage capacitive loads at the load stage 106 (e.g., the capacitive charge from the wafer plasma sheath 505 and/or the wall plasma sheath 510) with fast discharge times. A high voltage load can be a load with a voltage greater than about 1 kV, 10 kV, 20 kV, 50 kV, 100 kV, etc. A fast discharge time can be a time less than about 1 ns, 10 ns, 50 ns, 100 ns, 250 ns, 500 ns, 1,000 ns, etc.

The plasma sheath control system 700 can include the RF generator 515, the resistive output stage 705, the lead stage 103, DC bias circuit 104, and the second lead stage 105. A plasma sheath control system may include the plasma sheath control circuit and the load stage 106, which may include a plasma chamber.

Figure 8:
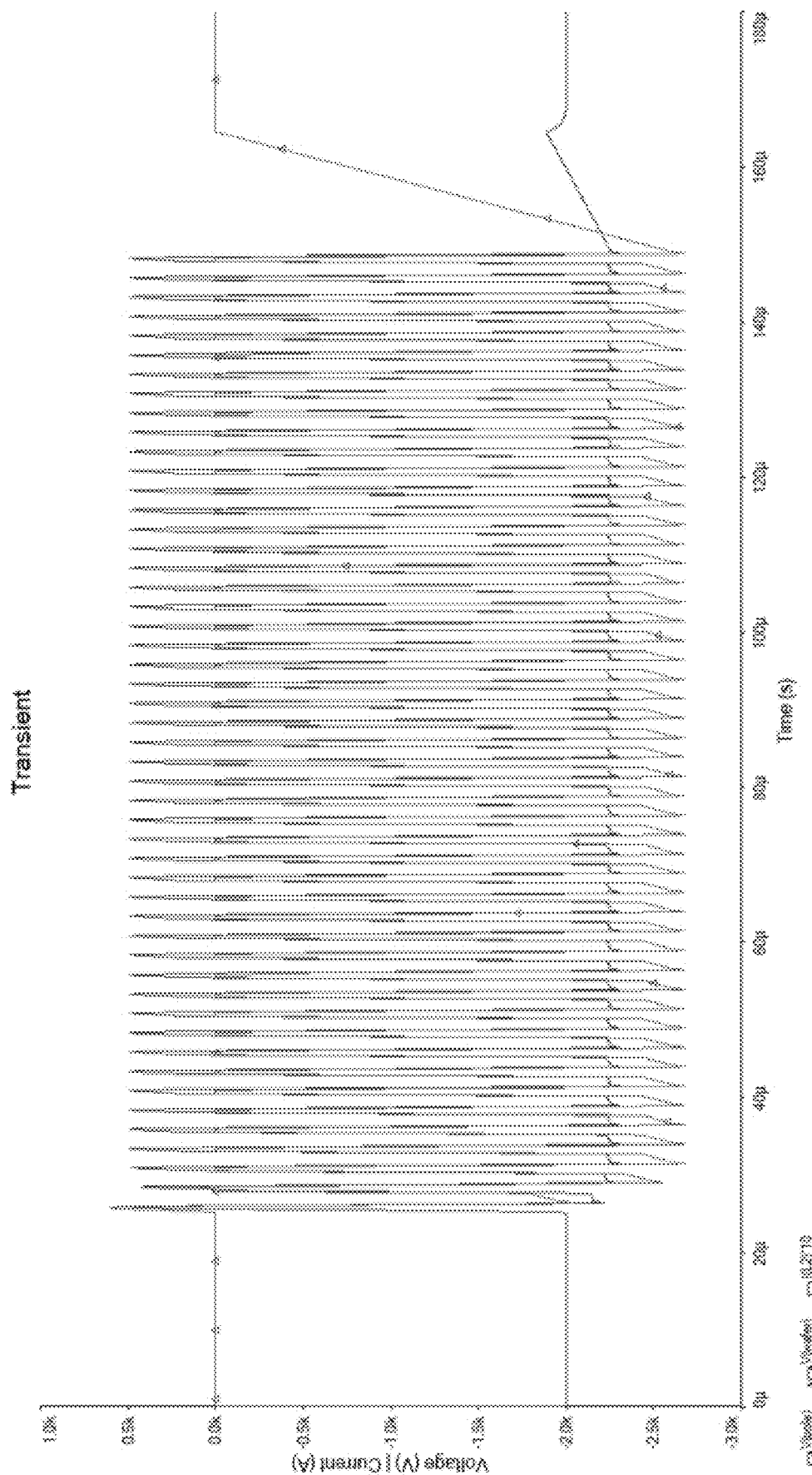
FIG. 8 illustrates waveforms across the sheath (e.g., C3) and at the chuck (e.g., C2) from the circuit shown in FIG. 7.

FIG. 8 illustrates waveforms across the sheath (e.g., across the capacitor C3), which is between circuit point 122 and circuit point 123, and at the chuck (e.g., across the capacitor C2), which is circuit point 121. FIG. 9 is a zoomed in view of three cycles of the waveforms shown in FIG. 8. Waveform 805 shows the voltage across the sheath (e.g., the capacitive charge from the wafer plasma sheath 505 and/or the wall plasma sheath 510). Waveform 805 is a pure sine wave that is slightly clipped at zero because of the of the diode (D3), which is part of the plasma effect. Waveform 810 shows the voltage at the pole (or across the chuck).

When the RF source V5 is on continuously, the flatness may be a consequence of the blocking diode D7 and/or the values of the all relevant capacitances including the plasma sheath capacitance in the circuit. The resistive output stage 705 may reset the sheath capacitor during one half period of the RF sinusoid. The waveform 805 is much flatter around −2.5 kV. The flatness of the waveform 805 may, for example, be better for keeping the ions at a constant potential during etching. The resistive output stage 705 and/or the blocking diode D7 may, for example, cause this flatness. The component values may be adjusted to vary the rise times, the fall times, and/or the degree of flatness of portions of the output waveform.

In some embodiments, the blocking diode D7 may be replaced with a switch such as, for example, a high voltage switch. A high voltage switch may include the high voltage switch 1800 shown in FIG. 18. The high voltage switch, for example, may be closed during forward conduction (e.g., when the RF generator 515 output is above a voltage threshold) and open during reverse bias (e.g., when the RF generator 515 output is below the voltage threshold).

Figure 10:
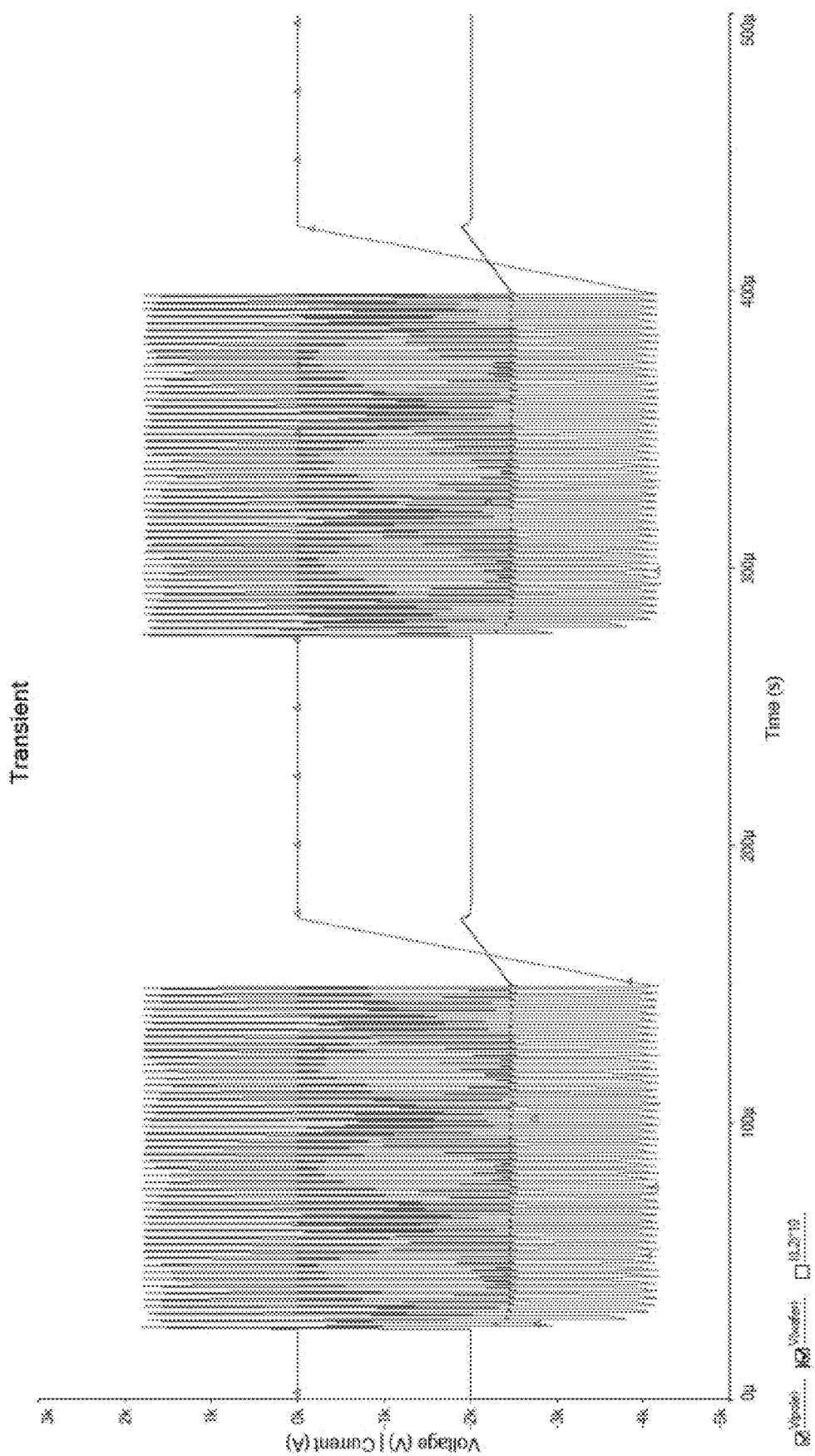
FIG. 10 illustrates waveforms across the sheath (e.g., C3) and at the chuck (e.g., C2) from the circuit shown in FIG. 7.
Figure 11:
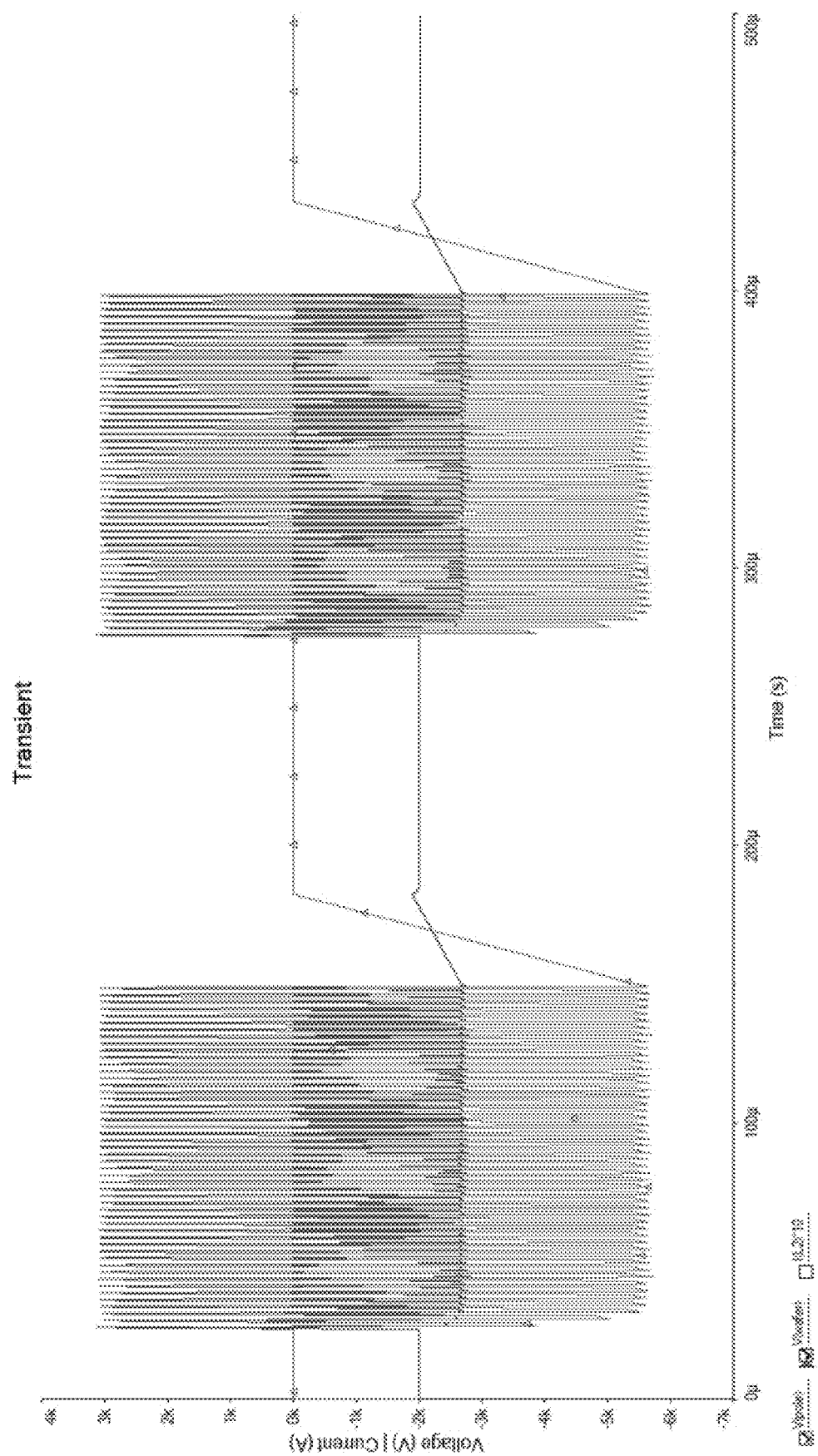
FIG. 11 illustrates waveforms across the sheath (e.g., C3) and at the chuck (e.g., C2) from the circuit shown in FIG. 7.

The chucking voltage may be around 500 V during the burst and about to 2 kV when off, which may be acceptable. Increasing the RF output voltage to around 4 kV the difference can be about 2 kV during both the on and the off periods, as shown in FIG. 10. Increasing the RF output voltage to around 6 kV the difference during the on time can be about 3 kV or greater which may not be acceptable and about 2 kV during the off time, as shown in FIG. 11. With a 3 kV difference, wafer damage may occur.

Figure 12:
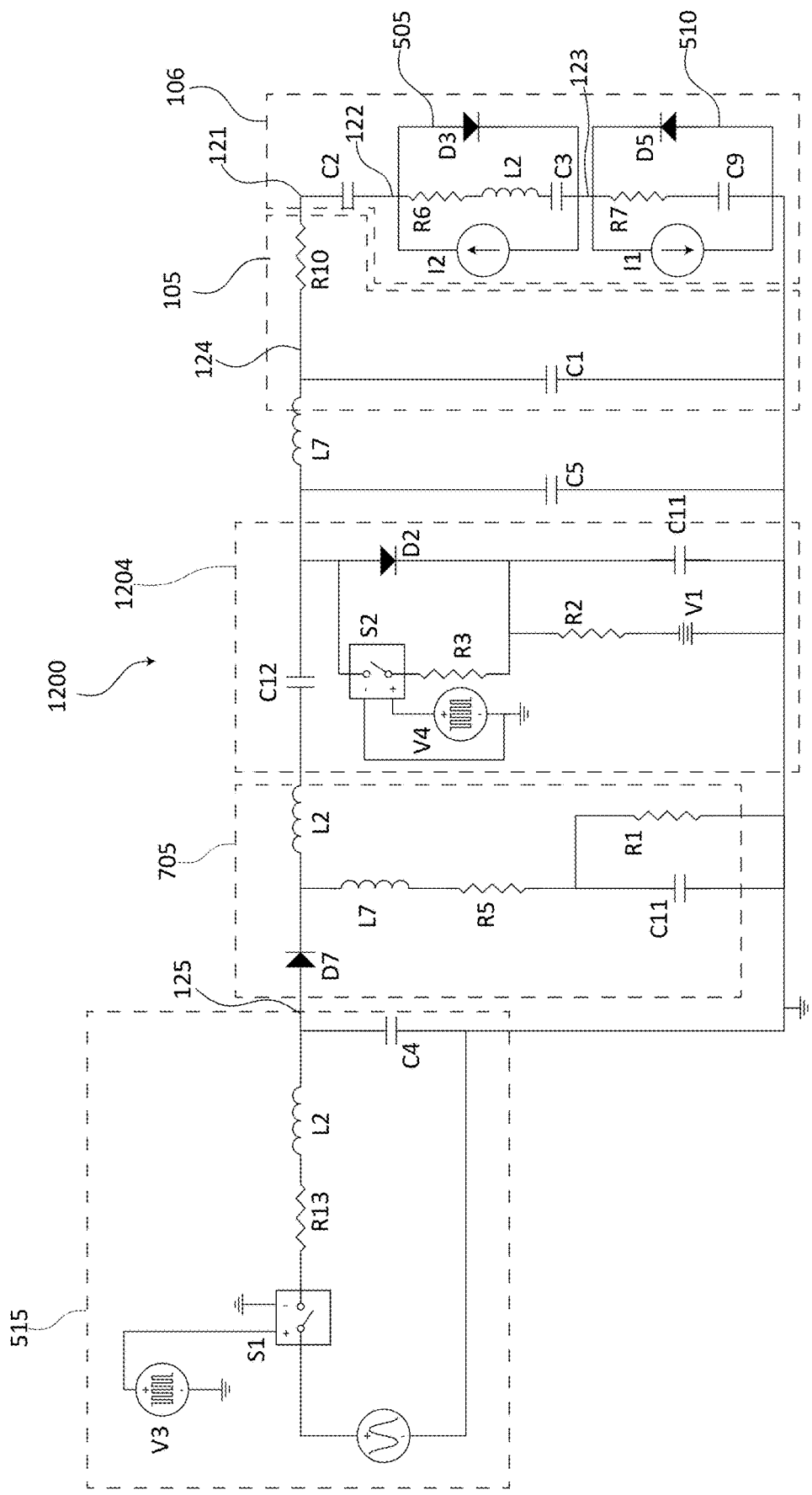
FIG. 12 is another schematic of an plasma sheath control system for an RF chamber with a resistive output stage and a high voltage switch bias compensation stage according to some embodiments.

FIG. 12 is another schematic of an plasma sheath control system 1200 of an RF plasma reactor with the resistive output stage 705 and a DC bias circuit 1204 according to some embodiments.

The DC bias circuit 1204 may include the components shown in DC bias circuit 104. The DC bias circuit 1204 may also include a high voltage switch S1 and/or blocking diode D2. In some embodiments, the high voltage switch S1 may include a plurality of switches arranged in series to collectively open and close high voltages. The high voltage switch S1 may comprise a high voltage switch such as, for example, the high voltage switch 1800 shown in FIG. 18.

In some embodiments, the high voltage switch S1 may be open while the RF power supply V5 voltage waveform is positive and closed when negative. While closed, the high voltage switch S1 may, for example, short current across blocking diode D2. Shorting this current may allow the bias between the wafer and the chuck to be maintained at approximately 2 kV, which may be within acceptable tolerances and/or may be adjusted by changing the DC bias supply voltage V1

Figure 13:
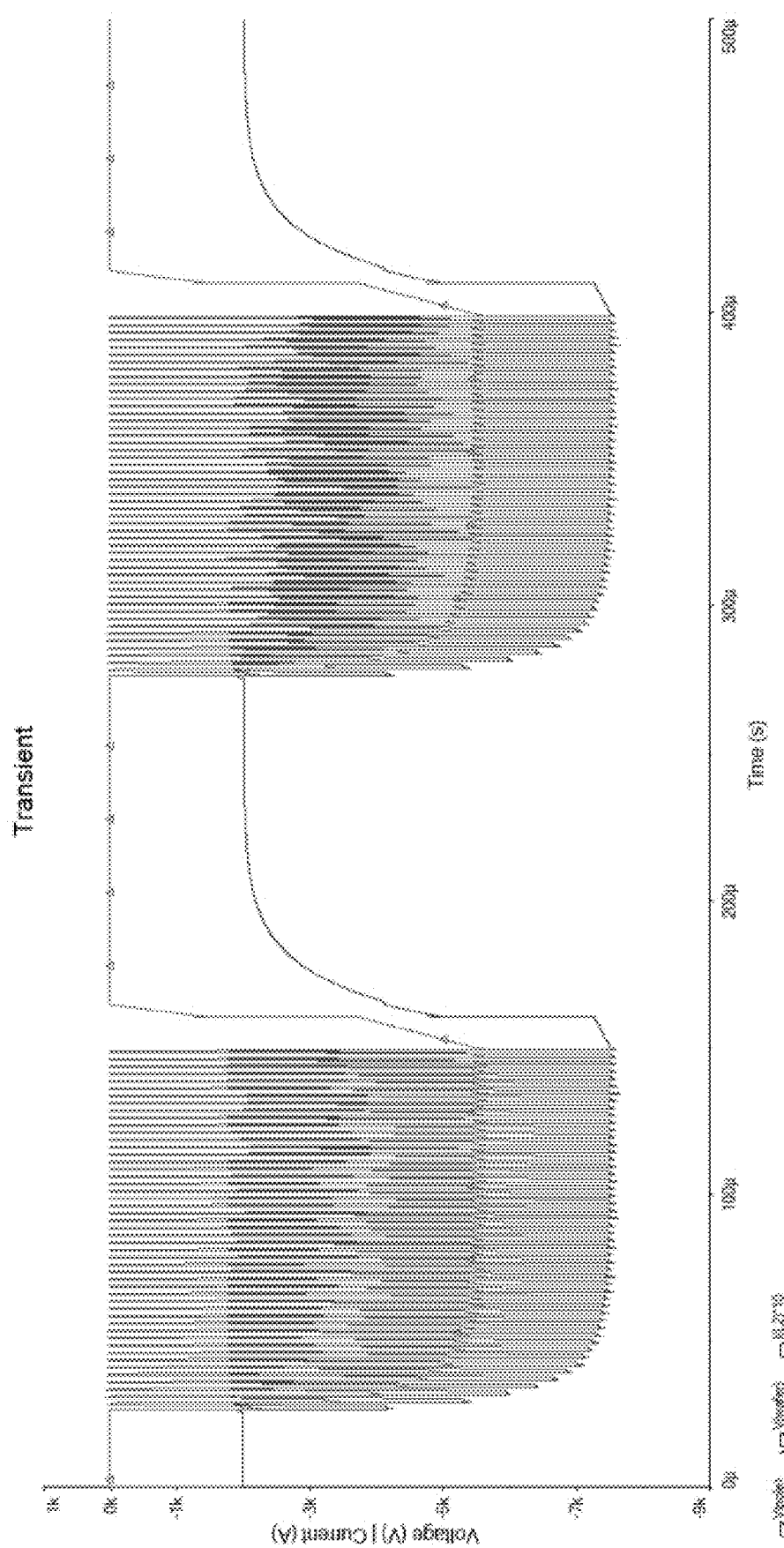
FIG. 13 illustrates waveforms across the sheath (e.g., C3) and at the chuck (e.g., C2) from the circuit shown in FIG. 12.

FIG. 13 illustrates waveforms across the sheath (e.g., C3) and at the chuck (e.g., C2) from the circuit shown in FIG. 12. As shown, the difference between the wafer and chucking voltage stay very close to −2 kV regardless of whether the RF power supply is on or off.

Figure 14:
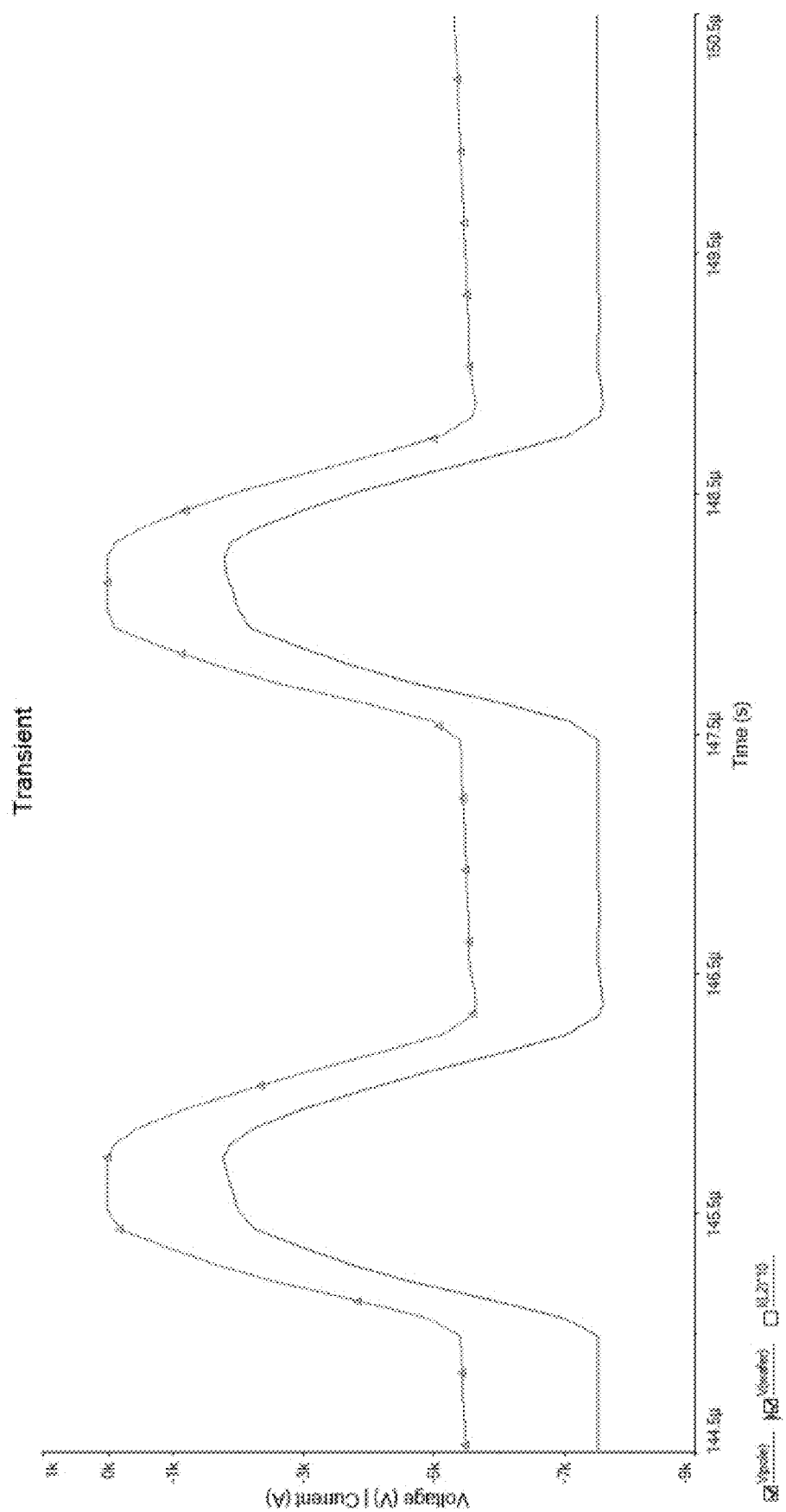
FIG. 14 is a zoomed in view of three cycles of the waveform shown in FIG. 12.

FIG. 14 is a zoomed in view of three cycles of the waveform shown in FIG. 12.

Figure 15:
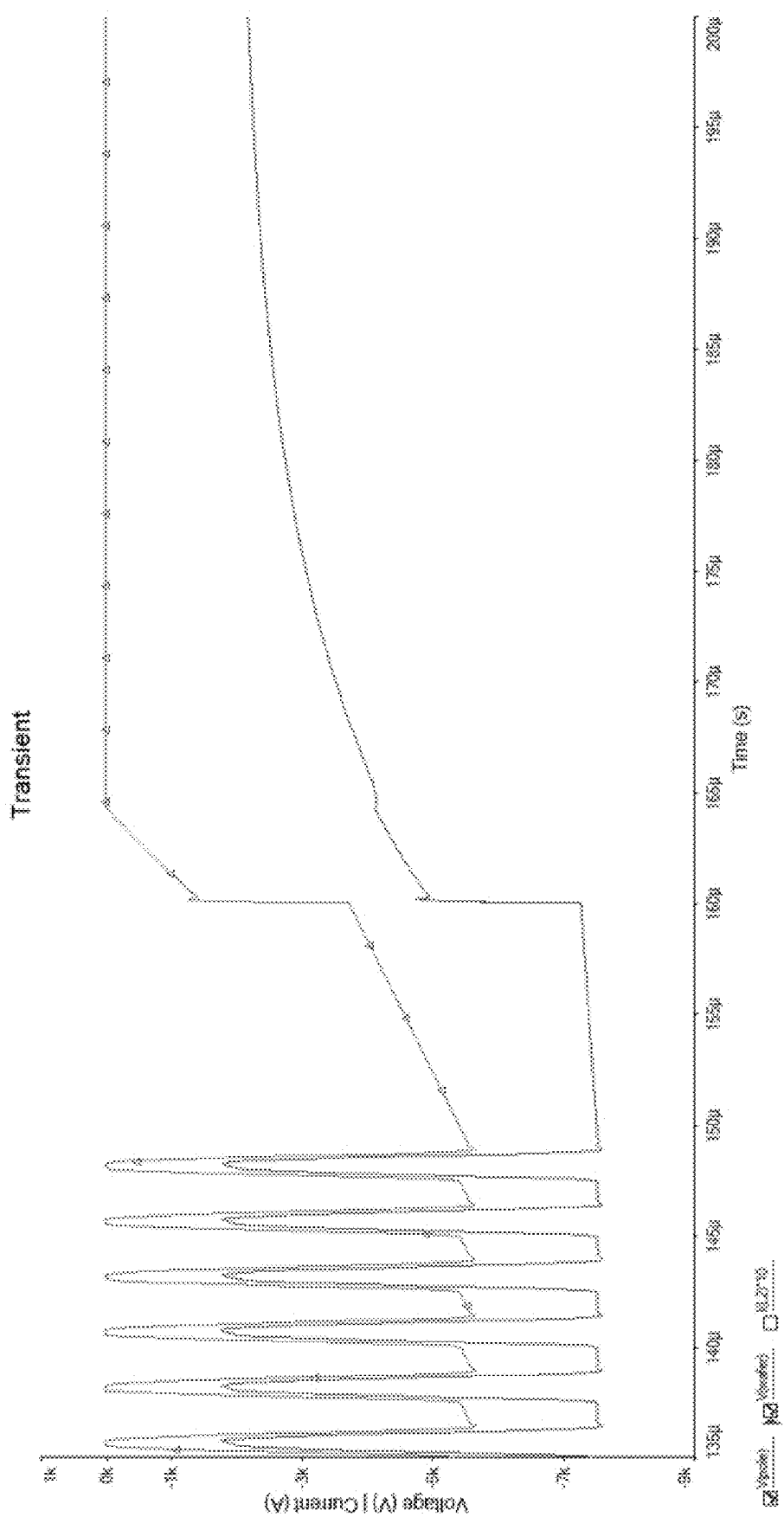
FIG. 15 shows the end of the burst waveform where the voltage on the chuck returns to zero.

FIG. 15 shows the end of the burst waveform where the voltage on the chuck returns to zero.

Figure 16:
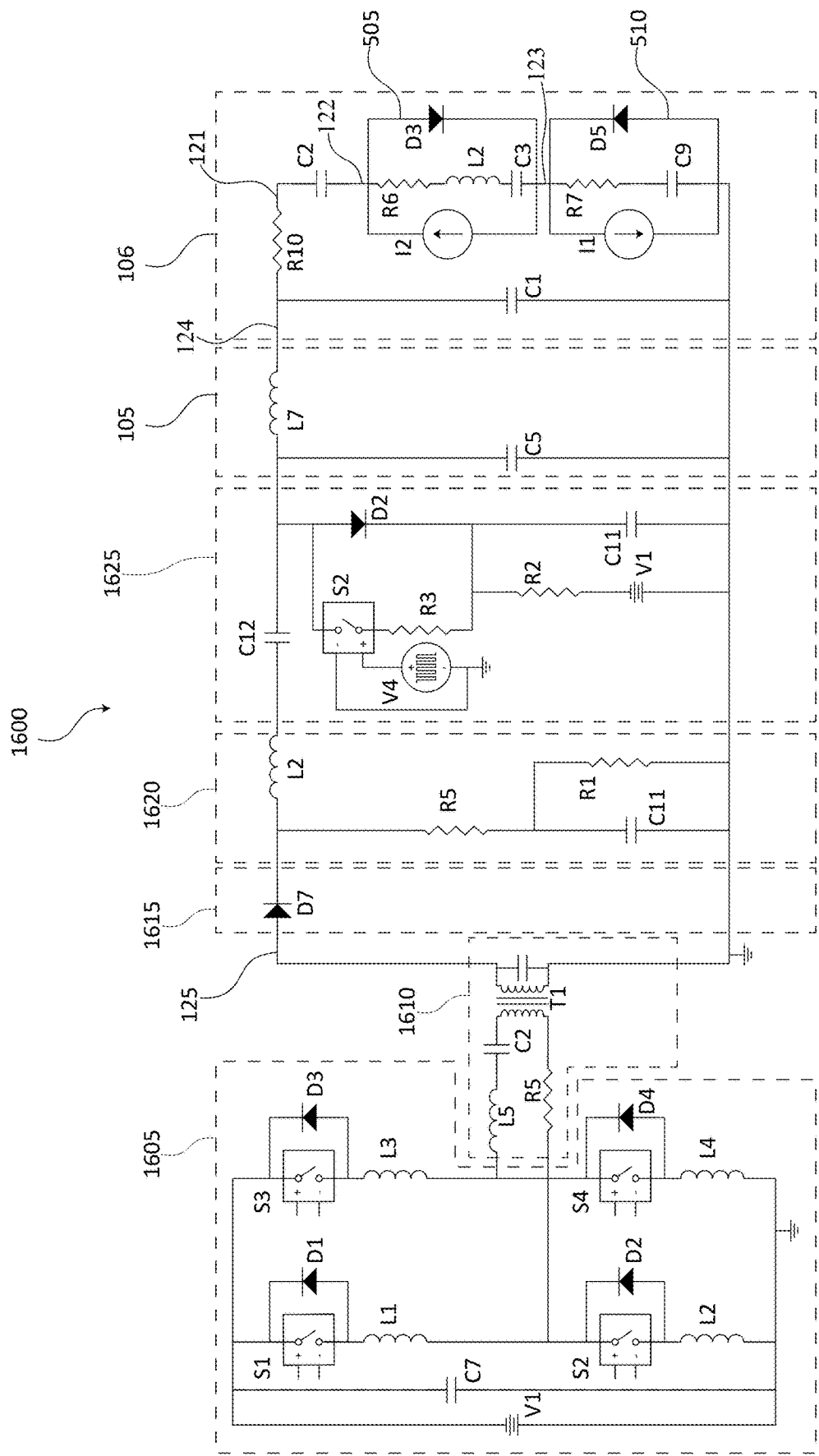
FIG. 16 is a schematic of a plasma sheath control system for an RF chamber having a resonant full-bridge driver according to some embodiments.

FIG. 16 is a circuit diagram of an plasma sheath control system 1600 according to some embodiments. In this example, the plasma sheath control system 1600 may include a full-bridge driver 1605. The full-bridge driver 1605 may include an input voltage source V1 that may be a DC voltage source (e.g., a capacitive source, AC-DC converter, etc.). In some embodiments, the full-bridge driver 1605 may include four switches. In some embodiments, the driver may include a plurality of switches in series or in parallel. These switches, for example, may include any type of solid-state switch such as, for example, IGBTs, a MOSFETs, a SiC MOSFETs, SiC junction transistors, FETs, SiC switches, GaN switches, photoconductive switches, etc. These switches may be switched at high frequencies and/or may produce a high voltage sinusoidal waveform. These frequencies may, for example, include frequencies of about 400 kHz, 0.5 MHz, 2.0 MHz, 4.0 MHz, 13.56 MHz, 27.12 MHz, 40.68 MHz, 50 MHz, etc.

In some embodiments, the full-bridge driver is coupled with a resonant circuit 1610. The resonant circuit 1610 may include a resonant inductor L5 and/or a resonant capacitor C2 coupled with a transformer T1. In some embodiments, the transformer T1 may be removed. The resonant circuit may also include stray resistance R5, for example, that may include the resistance of any leads between the full-bridge driver and the resonant circuit 1610 and/or any component within the resonant circuit 1610 such as, for example, the transformer T1, capacitor C2, the inductor L5, and the resistor R5.

While the inductance and/or capacitance of other circuit elements may affect the driving frequency, the driving frequency can be set largely by choice of the resonant inductor L5 and/or the resonant capacitor C2. Further refinements and/or tuning may be required to create the proper driving frequency. In addition, the rise time across the transformer T1 can be adjusted by changing the inductance of inductor L5 and/or the capacitance of capacitor C2, provided that:

$$f_{resonant} = \frac{1}{2\pi\sqrt{(L5)(C2)}} = \text{constant.}$$

For example, the capacitor C2, the resistor R5, or the inductor L5 may be tunable such that value for the device can be tuned or modified to ensure that the frequency is constant as other elements change over time In some embodiments, large inductance values for inductor L5 can result in slower or shorter rise times. These values may also affect the burst envelope. Each burst can include transient and steady state sinusoidal waveforms. The transient sinusoidal waveform within each burst are set by L5 and/or the Q of the system until full voltage is reached during the steady state sinusoidal waveforms.

If the switches in the driver circuit are switched at the resonant frequency, $f_{resonant}$, then the output voltage at the transformer will be amplified. In some embodiments, the resonant frequency may be about 20 Hz, 50 Hz, 100 Hz, 250 Hz, 400 kHz, 0.5 MHz, 2.0 MHz, 4.0 MHz, 13.56 MHz, 27.12 MHz, 40.68 MHz, 50 MHz, 100 MHz, etc.

In some embodiments, the resonant capacitor C2 may include the stray capacitance of the transformer T1 and/or a physical capacitor. In some embodiments, the resonant capacitor C2 may have a capacitance of about 10 µF, 1 µF, 100 nF, 10 nF, etc. In some embodiments, the resonant inductor L5 may include the stray inductance of the transformer T1 and/or a physical inductor. In some embodiments, the resonant inductor L5 may have an inductance of about 50 nH, 100 nH, 150 nH, 500 nH, 1,000 nH, etc. In some embodiments, the resonant resistor R5 may have a resistance of about 10 ohms, 25 ohms, 50 ohms, 100 ohms, 150 ohms, 500 ohms, etc.

In some embodiments, the plasma load within the plasma chamber may be a time varying load. This time variance may impact either or both the inductance or the capacitance of the resonant circuit, which may cause a shift in the resonant frequency, $f_{resonant}$. In some embodiments, the plasma sheath control system may include a controller (e.g., a microcontroller, FPGA, or any control device). In some embodiments, this controller may measure the output voltage and/or current of the plasma sheath control system, for example, at point 121. In some embodiments, this voltage or current measurement may be used to determine if the plasma sheath control system is operating at the resonant frequency. In some embodiments, if the system is not operating at the resonant frequency, the controller may change the operating frequency of the plasma sheath control system to match the resonant frequency such as, for example, by adjusting an inductance or capacitance value in the resonant circuit 1610.

In some embodiments, the amplitude of the current or voltage waveform produced by the plasma sheath control system, for example at point 121, 122, 124, 125, or at any point in the circuit may be measured by a controller. In some embodiments, the measured or current and/or voltage may be used to determine the output power of the plasma sheath control system. In some embodiments, the controller may alter the operating frequency, voltage, or duty cycle in response to this measurement to achieve a desired output voltage, current, or power level.

In some embodiments, either or both the operating frequency and output power of the plasma sheath control system may be controlled by the controller. In some embodiments, the controller may detect variation in the output waveforms and adjust the operating frequency and/or power level on a fast timescale, for example, less than about 100 ms, less than about 1 ms, less than about 10 µs, less than about 500 ns, etc.

In some embodiments, the resistor R5 may represent the stray resistance of wires, traces, and/or the transformer windings within the physical circuit. In some embodiments, the resistor R5 may have a resistance of about 10 mohms, 50 mohms, 100 mohms, 200 mohms, 500 mohms, etc.

In some embodiments, the transformer T1 may comprise a transformer as disclosed in U.S. patent application Ser. No. 15/365,094, titled "High Voltage Transformer," which is incorporated into this document for all purposes.

In some embodiments, the output voltage of the resonant circuit 1610 can be changed by changing the duty cycle (e.g., the switch "on" time or the time a switch is conducting) of switches S1, S2, S3, and/or S4. For example, the longer the duty cycle, the higher the output voltage; and the shorter the duty cycle, the shorter the output voltage. In some embodiments, the output voltage of the resonant circuit 1610 can be changed or tuned by adjusting the duty cycle of the switching in the full bridge driver. For example, by adjusting the duty cycle of the signals, for example, Sig1 and Sig2, which open and close the switches S1, S2, S3, and S4, the output voltage of the driver can be adjusted.

In some embodiments, each switch in the resonant circuit (e.g., S1, S2, S3, and/or S4) can be switched independently or in conjunction with one or more of the other switches.

In some embodiments, the resonant circuit 1610 may be coupled with a half-wave rectifier 1615 and/or a blocking diode D7. In some embodiments, the blocking diode D7 may be replaced with a switch such as, for example, a high voltage switch. A high voltage switch may include the high voltage switch 1800 shown in FIG. 18. The high voltage switch, for example, may be closed during forward conduction (e.g., when the RF generator 515 output is above a voltage threshold) and open during reverse bias (e.g., when the RF generator 515 output is below the voltage threshold).

In some embodiments, the blocking diode D7 may rectify the sinusoidal waveform s from the full-bridge driver 1605. For example, the blocking diode D7 may rectify the sinusoidal waveform creating an rectified sinusoidal waveform with a substantially flat portion for at least 10%, 15%, 20%, 25%, 30%, etc. of each period.

In some embodiments, the half-wave rectifier 1615 or the blocking diode D7 may be coupled with the resistive output stage 1620. The resistive output stage 1620 may include any resistive output stage known in the art. For example, the resistive output stage 1620 may include any resistive output stage described in U.S. patent application Ser. No. 16/178,538 titled "HIGH VOLTAGE RESISTIVE OUTPUT STAGE CIRCUIT," which is incorporated into this disclosure in its entirety for all purposes. For example, the resistive output stage 1620 may include elements in resistive output stage 705.

In some embodiments, the resistive output stage may include at least one resistor (e.g., R1) that discharges a load (e.g., the plasma sheath capacitance). In some embodiments, the resistive output stage may be configured to discharge over about 1 kilowatt of average power during each sinusoidal waveform cycle and/or a joule or less of energy in each sinusoidal waveform cycle. In some embodiments, the resistance of the resistor R1 in the resistive output stage may be less than 200 ohms. In some embodiments, the resistor R1 may comprise a plurality of resistors arranged in series or parallel having a combined capacitance less than about 200 pF (e.g., C11).

In some embodiments, the resistive output stage 1620 may include a collection of circuit elements that can be used to control the shape of a voltage waveform on a load. In some embodiments, the resistive output stage 1620 may include passive elements only (e.g., resistors, capacitors, inductors, etc.). In some embodiments, the resistive output stage 1620 may include active circuit elements (e.g., switches) as well as passive circuit elements. In some embodiments, the resistive output stage 1620, for example, can be used to control the voltage rise time of a waveform and/or the voltage fall time of waveform.

In some embodiments, the resistive output stage 1620 can discharge capacitive loads (e.g., the capacitive charge from the wafer plasma sheath 505 and/or the wall plasma sheath 510). For example, these capacitive loads may have small capacitance (e.g., about 10 pF, 100 pF, 500 pF, 1 nF, 10 nF, 100 nF, etc.).

In some embodiments, a resistive output stage 1620 can be used in circuits with sinusoidal waveform having a high peak voltage (e.g., voltages greater than 1 kV, 10 kV, 20 kV, 50 kV, 100 kV, etc.) and/or high frequencies (e.g., frequencies greater than 1 kHz, 10 kHz, 100 kHz, 200 kHz, 500 kHz, 1 MHz, etc.) and/or frequencies of about 400 kHz, 0.5 MHz, 2.0 MHz, 4.0 MHz, 13.56 MHz, 27.12 MHz, 40.68 MHz, 50 MHz, etc.

In some embodiments, the resistive output stage 1620 may be selected to handle high average power, high peak power, fast rise times and/or fast fall times. For example, the average power rating might be greater than about 0.5 kW, 1.0 kW, 10 kW, 25 kW, etc., and/or the peak power rating might be greater than about 1 kW, 10 kW, 100 kW, 1 MW, etc.

In some embodiments, the resistive output stage 1620 may include a series or parallel network of passive components. For example, the resistive output stage 1620 may include a series of a resistor, a capacitor, and an inductor. As another example, the resistive output stage 1620 may include a capacitor in parallel with an inductor and the capacitor-inductor combination in series with a resistor. For example, L11 can be chosen large enough so that there is no significant energy injected into the resistive output stage when there is voltage out of the rectifier. The values of R3 and R1 can be chosen so that the L/R time can drain the appropriate capacitors in the load faster than the RF frequency In some embodiments, the resistive output stage 1620 may be coupled with the bias compensation circuit 1625.

The bias compensation circuit 1625 may include any bias and/or bias compensation circuit known in the art. For example, the bias compensation circuit 1625 may include any bias and/or bias compensation circuit described in U.S. patent application Ser. No. 162/711,406 titled "NANOSECOND PULSER BIAS COMPENSATION," which is incorporated into this disclosure in its entirety for all purposes.

In some embodiments, the bias compensation circuit 1625 may include a bias capacitor C7, blocking capacitor C12, a blocking diode D8, switch S8 (e.g., a high voltage switch), offset supply voltage V1, resistance R2, and/or resistance R4. In some embodiments, the switch S8 comprises a high voltage switch such as, for example, the high voltage switch 1800 shown in FIG. 18.

In some embodiments, the offset supply voltage V5 may include a DC voltage source that can bias the output voltage either positively or negatively. In some embodiments, the capacitor C12 may isolate/separate the offset supply voltage V5 from the resistive output stage 1620 and/or other circuit elements. In some embodiments, the bias compensation circuit 1625 may allow for a potential shift of power from one portion of the circuit to another. In some embodiments, the bias compensation circuit 1625 may be used to hold a wafer in place as high voltage sinusoidal waveforms are active within the chamber. Resistance R2 may protect/isolate the DC bias supply from the bridge driver.

In some embodiments, the switch S8 may be open while the full-bridge driver 1605 is pulsing and closed when the full-bridge driver 1605 is not pulsing. While closed, the switch S8 may, for example, short current across the blocking diode D8. Shorting this current may allow the bias between the wafer and the chuck to be less than 2 kV, which may be within acceptable tolerances.

In some embodiments, the plasma sheath control system 1600 may or may not include a traditional matching network such as, for example, a 50 ohm matching network or an external matching network or standalone matching network. The embodiments described within this document may or may not require a 50 ohm matching network to tune the switching power applied to the wafer chamber. Typically, tuning of the matching network can take at least 100 µs-200 µs. In some embodiments, power changes can occur within one or two RF cycles, for example, 2.5 µs-5.0 µs at 400 kHz.

Figure 17:
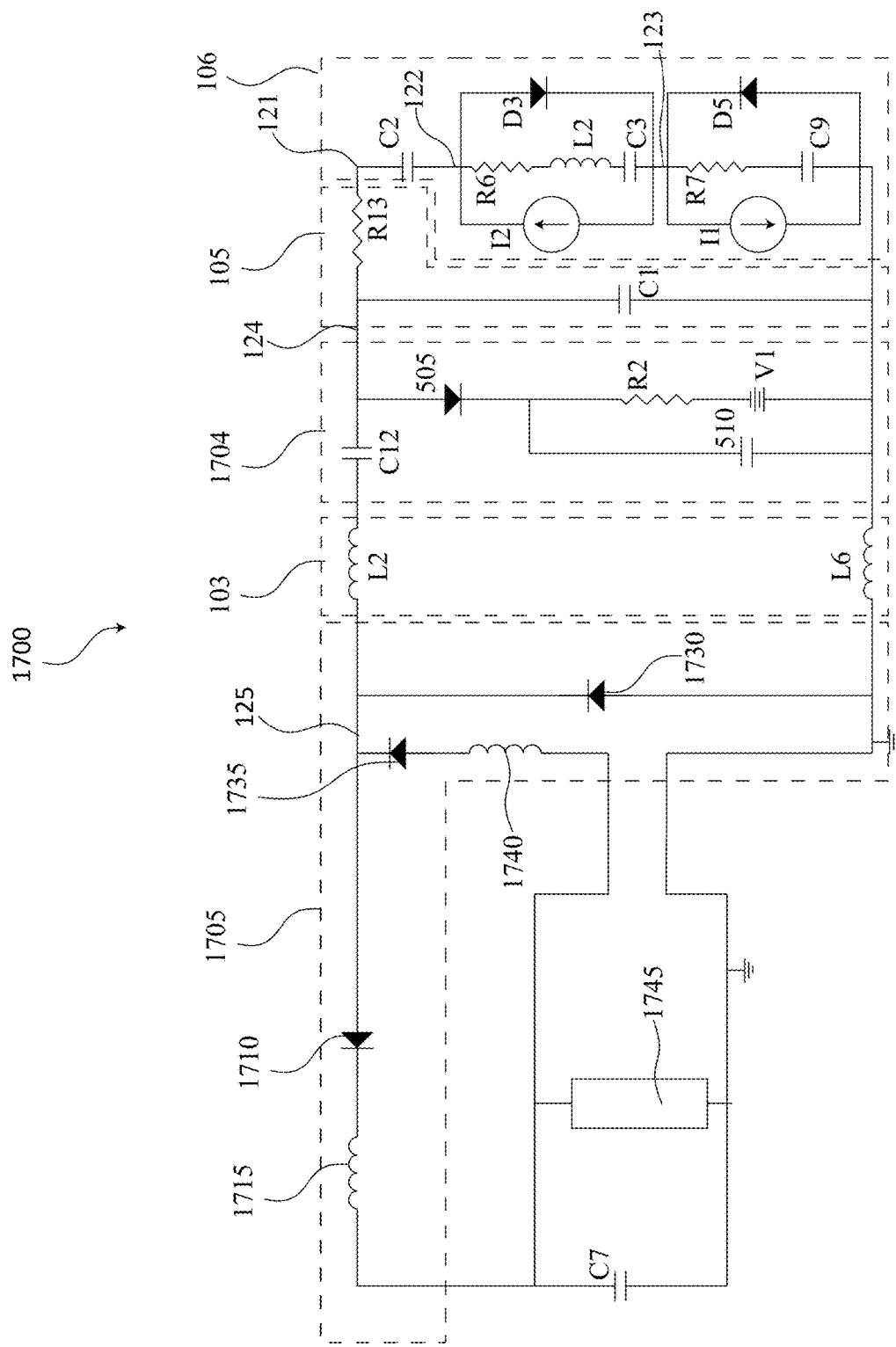
FIG. 17 is a circuit diagram of a plasma sheath control system with an energy recovery circuit according to some embodiments.

FIG. 17 is a circuit diagram of an plasma sheath control system 1700 according to some embodiments. The plasma sheath control system 1700 includes waveform generator 1745 that produces high voltage and high frequency sinusoidal waveforms such as, for example, to drive a plasma chamber. In some embodiments, the waveform generator 1745 may include any device that produces sinusoidal waveforms with a peak voltage greater than 1 kV, 10 kV, 20 kV, 50 kV, 100 kV, etc. and high frequencies greater than 1 kHz, 10 kHz, 100 kHz, 200 kHz, 500 kHz, 1 MHz, etc.

In some embodiments, the waveform generator 1745 may include the RF generator 515, the full-bridge driver 1605, or the half-bridge driver 1905. In some embodiments, the waveform generator 1745 may or may not include a transformer.

In some embodiments, the waveform generator 1745 may be couple with an energy recovery circuit 1705. If the waveform generator 1745 includes a transformer, then the energy recovery circuit 1705 may be positioned on or electrically coupled with the secondary side of the transformer T1.

The energy recovery circuit 1705, for example, may include a diode 1730 (e.g., a crowbar diode) across the secondary side of the transformer T1. The energy recovery circuit 1705, for example, may include diode 1710 and inductor 1715 (arranged in series), which can allow current to flow from a discharge of the load stage 106 (e.g., a capacitive load) to charge the power supply C7. The diode 1710 and the inductor 1715 may be electrically connected with the load stage 106 and the power supply C7.

In some embodiments, the energy recovery circuit 1705 may include blocking diode 1735. The blocking diode 1735 may be similar to blocking diode D7 or may operate in a manner similar to blocking diode D7. For example, blocking diode 1735 may rectify Sinusoidal waveforms that may, for example, produce a flat top on each sinusoidal waveform (e.g., as shown in FIG. 9). For example, the blocking diode 1735 may rectify the Sinusoidal waveform creating an Sinusoidal waveform with a substantially flat portion for at least 10%, 15%, 20%, 25%, 30%, etc. of each period.

In some embodiments, the blocking diode 1735 may be replaced with a switch such as, for example, a high voltage switch. A high voltage switch may include the high voltage switch 1800 shown in FIG. 18. The high voltage switch, for example, may be closed during forward conduction (e.g., when the RF generator 515 output is above a voltage threshold) and open during reverse bias (e.g., when the RF generator 515 output is below the voltage threshold).

In some embodiments, the energy recovery circuit 1705 may include inductor 1740, which may be electrically coupled with the load stage 106. The inductor 1740 may represent the stray inductance of a transformer within the waveform generator 1745 and/or may include the stray inductance between the waveform generator 1745 and the energy recovery circuit 1705 (e.g., the inductance transformer T1).

When the waveform generator 1745 is turned on, current may charge the load stage 106 (e.g., charge the capacitor C3, capacitor C2, or capacitor C9). Some current, for example, may flow through inductor 1715 when the voltage on the secondary side of the transformer T1 rises above the charge voltage on the power supply C7. When the waveform generator 1745 is turned off, current may flow from the capacitors within the load stage 106 through the inductor 1715 to charge the power supply C7 until the voltage across the inductor 1715 is zero. The diode 1730 may prevent the capacitors within the load stage 106 from ringing with the inductance in the load stage 106 or the DC bias circuit 104.

The diode 1710 may, for example, prevent charge from flowing from the power supply C7 to the capacitors within the load stage 106.

The value of inductor 1715 can be selected to control the current fall time. In some embodiments, the inductor 1715 can have an inductance value between 1-500 µH.

In some embodiments, the energy recovery circuit 1705 may include a switch that can be used to control the flow of current through the inductor 1715. The switch, for example, may be placed in series with the inductor 1715. In some embodiments, the switch may be closed when the switch S1 is open and/or no longer pulsing to allow current to flow from the load stage 106 back to the high voltage load C7. The switch, for example, may include a high voltage switch such as, for example, the high voltage switch 1800.

The energy recovery circuit 1705 may be added to the plasma sheath control system 500, plasma sheath control system 700, plasma sheath control system 1200, plasma sheath control system 1600, or plasma sheath control system 1900. In some embodiments the energy recovery circuit 1705 may replace a resistive output stage such as, for example, resistive output stage 705 or resistive output stage 1620.

The DC bias circuit 1704 may include a DC bias circuit 1704, the bias compensation circuit 1625, the DC bias circuit 1204, or the DC bias circuit 104.

The second lead stage 105 may represent circuit elements between the waveform generator 1745 and the load stage 106.

In this example, plasma sheath control system 1700 may be coupled with and may provide a sinusoidal waveform to a load stage 106, which may, for example, include any or elements of load stage 106.

Figure 18:
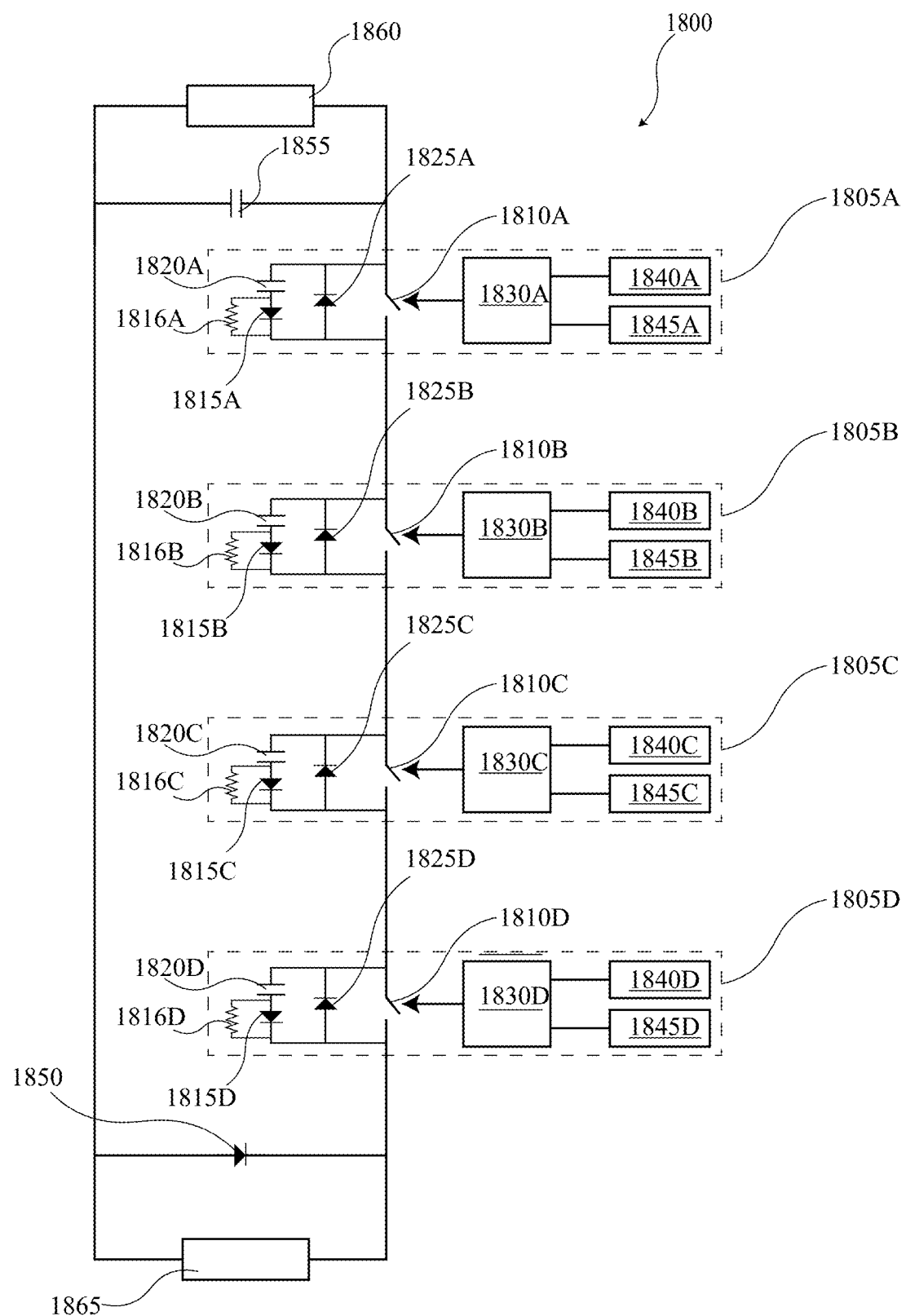
FIG. 18 is a block diagram of a high voltage switch with isolated power according to some embodiments.

FIG. 18 is a block diagram of a high voltage switch 1800 with isolated power according to some embodiments. The high voltage switch 1800 may include a plurality of switch modules 1805 (collectively or individually 1805, and individually 1805A, 1805B, 1805C, and 1805D) that may switch voltage from a high voltage source 1860 with fast rise times and/or high frequencies and/or with variable periods. Each switch module 1805 may include a switch 1810 such as, for example, a solid state switch.

In some embodiments, the switch 1810 may be electrically coupled with a gate driver circuit 1830 that may include a power supply 1840 (e.g., 1840A, 1840B, 1840C, or 1840D) and/or an isolated fiber trigger 1845 (e.g., 1845A, 1845B, 1845C, or 1845D) (also referred to as a gate trigger or a switch trigger). For example, the switch 1810 may include a collector, an emitter, and a gate (or a drain, a source, and a gate) and the power supply 1840 may drive the gate of the switch 1810 via the gate driver circuit 1830. The gate driver circuit 1830 may, for example, be isolated from the other components of the high voltage switch 1800.

In some embodiments, the power supply 1840 may be isolated, for example, using an isolation transformer. The isolation transformer may include a low capacitance transformer. The low capacitance of the isolation transformer may, for example, allow the power supply 1840 to charge on fast time scales without requiring significant current. The isolation transformer may have a capacitance less than, for example, about 100 pF. As another example, the isolation transformer may have a capacitance less than about 30-100 pF. In some embodiments, the isolation transformer may provide voltage isolation up to 1 kV, 5 kV, 10 kV, 25 kV, 50 kV, etc.

In some embodiments, the isolation transformer may have a low stray capacitance. For example, the isolation transformer may have a stray capacitance less than about 1,000 pF, 100 pF, 10 pF, etc. In some embodiments, low capacitance may minimize electrical coupling to low voltage components (e.g., the source of the input control power) and/or may reduce EMI generation (e.g., electrical noise generation). In some embodiments, the transformer stray capacitance of the isolation transformer may include the capacitance measured between the primary winding and secondary winding.

In some embodiments, the isolation transformer may be a DC to DC converter or an AC to DC transformer. In some embodiments, the transformer, for example, may include a 110 V AC transformer. Regardless, the isolation transformer can provide isolated power from other components in the high voltage switch 1800. In some embodiments, the isolation may be galvanic, such that no conductor on the primary side of the isolation transformer passes through or makes contact with any conductor on the secondary side of the isolation transformer.

In some embodiments, the transformer may include a primary winding that may be wound or wrapped tightly around the transformer core. In some embodiments, the primary winding may include a conductive sheet that is wrapped around the transformer core. In some embodiments, the primary winding may include one or more windings.

In some embodiments, a secondary winding may be wound around the core as far from the core as possible. For example, the bundle of windings comprising the secondary winding may be wound through the center of the aperture in the transformer core. In some embodiments, the secondary winding may include one or more windings. In some embodiments, the bundle of wires comprising the secondary winding may include a cross section that is circular or square, for example, to minimize stray capacitance. In some embodiments, an insulator (e.g., oil or air) may be disposed between the primary winding, the secondary winding, or the transformer core.

In some embodiments, keeping the secondary winding far from the transformer core may have some benefits. For example, it may reduce the stray capacitance between the primary side of the isolation transformer and secondary side of the isolation transformer. As another example, it may allow for high voltage standoff between the primary side of the isolation transformer and the secondary side of the isolation transformer, such that corona and/or breakdown is not formed during operation.

In some embodiments, spacings between the primary side (e.g., the primary windings) of the isolation transformer and the secondary side of the isolation transformer (e.g., the secondary windings) can be about 0.1", 0.5", 1", 5", or 10". In some embodiments, typical spacings between the core of the isolation transformer and the secondary side of the isolation transformer (e.g., the secondary windings) can be about 0.1", 0.5", 1", 5", or 10". In some embodiments, the gap between the windings may be filled with the lowest dielectric material possible such as, for example, vacuum, air, any insulating gas or liquid, or solid materials with a relative dielectric constant less than 3.

In some embodiments, the power supply 1840 may include any type of power supply that can provide high voltage standoff (isolation) or have low capacitance (e.g., less than about 1,000 pF, 100 pF, 10 pF, etc.). In some embodiments, the control voltage power source may supply 1820 V AC or 240 V AC at 60 Hz.

In some embodiments, each power supply 1840 may be inductively electrically coupled with a single control voltage power source. For example, the power supply 1840A may be electrically coupled with the power source via a first transformer; the power supply 1840B may be electrically coupled with the power source via a second transformer; the power supply 1840C may be electrically coupled with the power source via a third transformer; and the power supply 1840D may be electrically coupled with the power source via a fourth transformer. Any type of transformer, for example, may be used that can provide voltage isolation between the various power supplies.

In some embodiments, the first transformer, the second transformer, the third transformer, and the fourth transformer may comprise different secondary winding around a core of a single transformer. For example, the first transformer may comprise a first secondary winding, the second transformer may comprise a second secondary winding, the third transformer may comprise a third secondary winding, and the fourth transformer may comprise a fourth secondary winding. Each of these secondary winding may be wound around the core of a single transformer. In some embodiments, the first secondary winding, the second secondary winding, the third secondary winding, the fourth secondary winding, or the primary winding may comprise a single winding or a plurality of windings wound around the transformer core.

In some embodiments, the power supply 1840A, the power supply 1840B, the power supply 1840C, and/or the power supply 1840D may not share a return reference ground or a local ground.

The isolated fiber trigger 1845, for example, may also be isolated from other components of the high voltage switch 1800. The isolated fiber trigger 1845 may include a fiber optic receiver that allows each switch module 1805 to float relative to other switch modules 1805 and/or the other components of the high voltage switch 1800, and/or, for example, while allowing for active control of the gates of each switch module 1805.

In some embodiments, return reference grounds or local grounds or common grounds for each switch module 1805, for example, may be isolated from one another, for example, using an isolation transformer.

Electrical isolation of each switch module 1805 from common ground, for example, can allow multiple switches to be arranged in a series configuration for cumulative high voltage switching. In some embodiments, some lag in switch module timing may be allowed or designed. For example, each switch module 1805 may be configured or rated to switch 1 kV, each switch module may be electrically isolated from each other, and/or the timing of closing each switch module 1805 may not need to be perfectly aligned for a period of time defined by the capacitance of the snubber capacitor and/or the voltage rating of the switch.

In some embodiments, electrical isolation may provide many advantages. One possible advantage, for example, may include minimizing switch to switch jitter and/or allowing for arbitrary switch timing. For example, each switch 1810 may have switch transition jitters less than about 500 ns, 50 ns, 20 ns, 5 ns, etc.

In some embodiments, electrical isolation between two components (or circuits) may imply extremely high resistance between two components and/or may imply a small capacitance between the two components.

Each switch 1810 may include any type of solid state switching device such as, for example, an IGBT, a MOSFET, a SiC MOSFET, SiC junction transistor, FETs, SiC switches, GaN switches, photoconductive switch, etc. The switch 1810, for example, may be able to switch high voltages (e.g., voltages greater than about 1 kV), with high frequency (e.g., greater than 1 kHz), at high speeds (e.g., a repetition rate greater than about 500 kHz) and/or with fast rise times (e.g., a rise time less than about 25 ns). In some embodiments, each switch may be individually rated for switching 1,200 V-1,700 V, yet in combination can switch greater than 4,800 V-6,800 V (for four switches). Switches with various other voltage ratings may be used.

There may be some advantages to using a large number of lower voltage switches rather than a few higher voltage switches. For example, lower voltage switches typically have better performance: lower voltage switches may switch faster, may have faster transition times, and/or may switch more efficiently than high voltage switches. However, the greater the number of switches the greater the timing issues that may be required.

The high voltage switch 1800 shown in FIG. 18 includes four switch modules 1805. While four are shown in this figure, any number of switch modules 1805 may be used such as, for example, two, eight, twelve, sixteen, twenty, twenty-four, etc. For example, if each switch in each switch module 1805 is rated at 1200 V, and sixteen switches are used, then the high voltage switch can switch up to 19.2 kV. As another example, if each switch in each switch module 1805 is rated at 1700 V, and sixteen switches are used, then the high voltage switch can switch up to 27.2 kV.

In some embodiments, the high voltage switch 1800 may include a fast capacitor 1855. The fast capacitor 1855, for example, may include one or more capacitors arranged in series and/or in parallel. These capacitors may, for example, include one or more polypropylene capacitors. The fast capacitor 1855 may store energy from the high voltage source 1860.

In some embodiments, the fast capacitor 1855 may have low capacitance. In some embodiments, the fast capacitor 1855 may have a capacitance value of about 1 µF, about 5 µF, between about 1 µF and about 5 µF, between about 100 nF and about 1,000 nF etc.

In some embodiments, the high voltage switch 1800 may or may not include a crowbar diode 1850. The crowbar diode 1850 may include a plurality of diodes arranged in series or in parallel that may, for example, be beneficial for driving inductive loads. In some embodiments, the crowbar diode 1850 may include one or more Schottky diodes such as, for example, a silicon carbide Schottky diode. The crowbar diode 1850 may, for example, sense whether the voltage from the switches of the high voltage switch is above a certain threshold. If it is, then the crowbar diode 1850 may short the power from switch modules to ground. The crowbar diode, for example, may allow an alternating current path to dissipate energy stored in the inductive load after switching. This may, for example, prevent large inductive voltage spikes. In some embodiments, the crowbar diode 1850 may have low inductance such as, for example, 1 nH, 10 nH, 100 nH, etc. In some embodiments, the crowbar diode 1850 may have low capacitance such as, for example, 100 pF, 1 nF, 10 nF, 100 nF, etc.

In some embodiments, the crowbar diode 1850 may not be used such as, for example, when the load 1865 is primarily resistive.

In some embodiments, each gate driver circuit 1830 may produce less than about 1000 ns, 100 ns, 10.0 ns, 5.0 ns, 3.0 ns, 1.0 ns, etc. of jitter. In some embodiments, each switch 1810 may have a minimum switch on time (e.g., less than about 10 µs, 1 µs, 500 ns, 100 ns, 50 ns, 10, 5 ns, etc.) and a maximum switch on time (e.g., greater than 25 s, 10 s, 5 s, 1 s, 500 ms, etc.).

In some embodiments, during operation each of the high voltage switches may be switched on and/or off within 1 ns of each other.

In some embodiments, each switch module 1805 may have the same or substantially the same (±5%) stray inductance. Stray inductance may include any inductance within the switch module 1805 that is not associated with an inductor such as, for example, inductance in leads, diodes, resistors, switch 1810, and/or circuit board traces, etc. The stray inductance within each switch module 1805 may include low inductance such as, for example, an inductance less than about 300 nH, 100 nH, 10 nH, 1 nH, etc. The stray inductance between each switch module 1805 may include low inductance such as, for example, an inductance less than about 300 nH, 100 nH, 10 nH, 1 nH, etc.

In some embodiments, each switch module 1805 may have the same or substantially the same (±5%) stray capacitance. Stray capacitance may include any capacitance within the switch module 1805 that is not associated with a capacitor such as, for example, capacitance in leads, diodes, resistors, switch 1810 and/or circuit board traces, etc. The stray capacitance within each switch module 1805 may include low capacitance such as, for example, less than about 1,000 pF, 100 pF, 10 pF, etc. The stray capacitance between each switch module 1805 may include low capacitance such as, for example, less than about 1,000 pF, 100 pF, 10 pF, etc.

Imperfections in voltage sharing can be addressed, for example, with a passive snubber circuit (e.g., the snubber diode 1815, the snubber capacitor 1820, and/or the freewheeling diode 1825). For example, small differences in the timing between when each of the switches 1810 turn on or turn off or differences in the inductance or capacitances may lead to voltage spikes. These spikes can be mitigated by the various snubber circuits (e.g., the snubber diode 1815, the snubber capacitor 1820, and/or the freewheeling diode 1825).

A snubber circuit, for example, may include a snubber diode 1815, a snubber capacitor 1820, a snubber resistor 1816, and/or a freewheeling diode 1825. In some embodiments, the snubber circuit may be arranged together in parallel with the switch 1810. In some embodiments, the snubber capacitor 1820 may have low capacitance such as, for example, a capacitance less than about 100 pF.

In some embodiments, the high voltage switch 1800 may be electrically coupled with or include a load 1865 (e.g., a resistive or capacitive or inductive load). The load 1865, for example, may have a resistance from 50 ohms to 500 ohms. Alternatively or additionally, the load 1865 may be an inductive load or a capacitive load.

Figure 19:
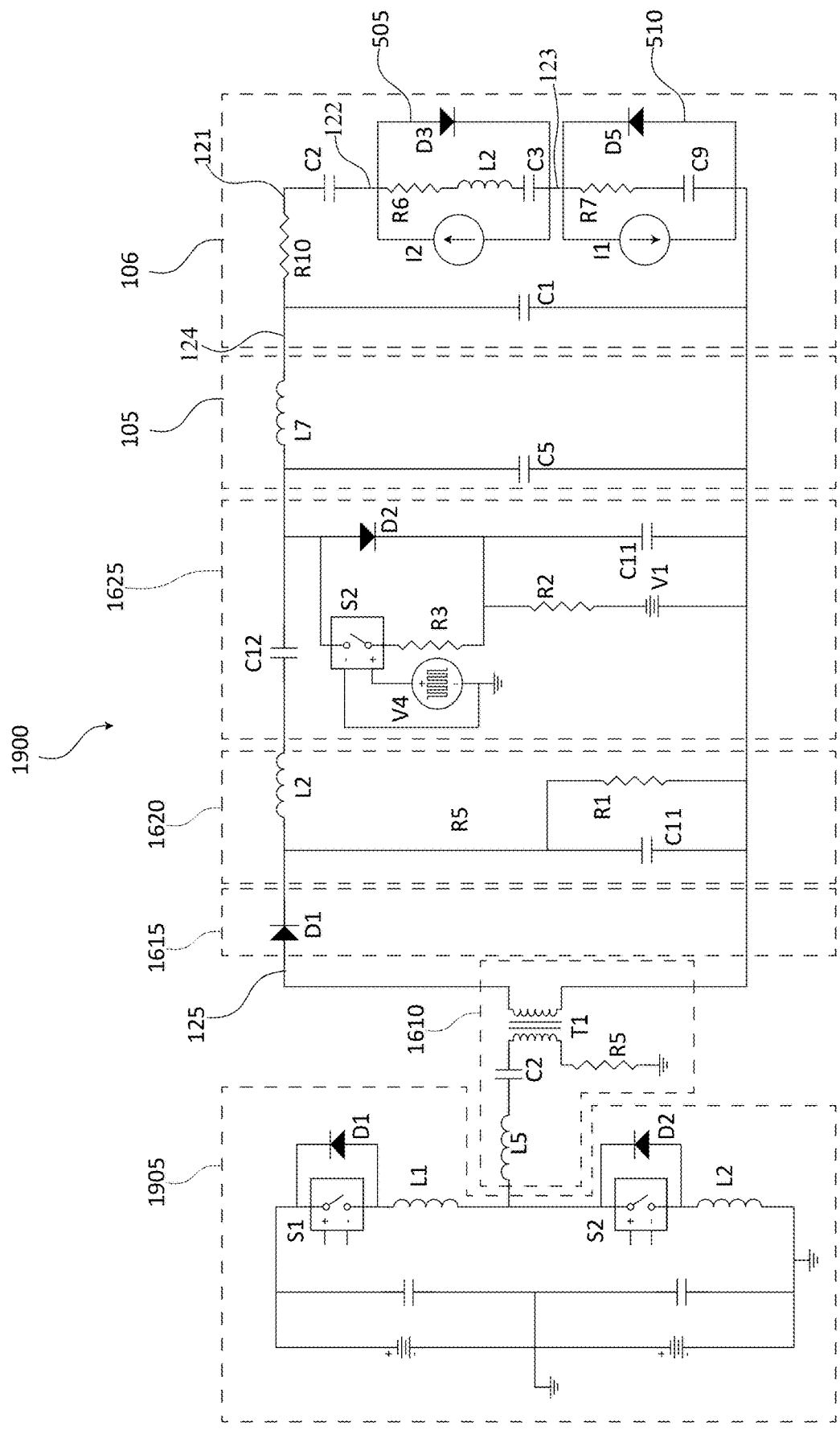
FIG. 19 is a circuit diagram of an plasma sheath control system with a half bridge resonant circuit according to some embodiments.

FIG. 19 is a circuit diagram of an plasma sheath control system 1900 according to some embodiments. In this example, the plasma sheath control system 1900 may include a half-bridge driver 1905 rather than the full-bridge driver 1605 shown in FIG. 16. The switches S1 and S2 may be alternately opened to allow current to flow in one direction through the load during a first time period, and allow current to flow in the opposite direction through the load during a second time period In some embodiments, a matching network may be included to is used to match the impedance of the plasma chamber to the impedance of the RF generator in order, for example, to deliver the maximum power to the plasma. This may be beneficial, for example, when using a 50 ohm system. For example, in plasma sheath control system 500, plasma sheath control system 700, or plasma sheath control system 1200 may include a matching network near resistor R13. As another example, the plasma sheath control system 1600, the plasma sheath control system 1700, or plasma sheath control system 1900 may include a matching network prior to inductor L2.

Unless otherwise specified, the term "substantially" means within 5% or 10% of the value referred to or within manufacturing tolerances. Unless otherwise specified, the term "about" means within 5% or 10% of the value referred to or within manufacturing tolerances.

As used in this document, the conjunction "or" is inclusive.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A plasma sheath control system comprising:
   an RF power supply that produces a sinusoidal waveform with a frequency greater than 20 kHz and a peak voltage greater than 1 kV;
   a plasma chamber electrically coupled with the RF power supply, the plasma chamber having a plurality of ions that are accelerated into a surface disposed within the plasma chamber with energies greater than about 1 kV, and the plasma chamber produces a plasma sheath within the plasma chamber from the sinusoidal waveform;
   a blocking diode electrically connected between the RF power supply and the plasma chamber, the blocking diode rectifies the sinusoidal waveform; and
   a capacitive discharge circuit that is separate and distinct from the plasma chamber and electrically coupled with the RF power supply, the plasma chamber, and the blocking diode; the capacitive discharge circuit discharges capacitive charges from within the plasma chamber with a peak voltage greater than 1 kV and with a discharge time that less than 250 nanoseconds.

2. The plasma sheath control system according to claim 1, wherein the capacitive discharge circuit comprises a resistive output stage comprising a resistor and an inductor arranged in series, the resistive output stage disposed between a point on the plasma sheath control system between the blocking diode and the plasma chamber and ground.

3. The plasma sheath control system according to claim 1, wherein the capacitive discharge circuit comprises an energy recovery circuit comprising a diode and an inductor arranged in series, the energy recovery circuit disposed between the blocking diode and the plasma chamber and the RF power supply.

4. The plasma sheath control system according to claim 1, further comprising a bias capacitor disposed in series between the blocking diode and the plasma chamber.

5. The plasma sheath control system according to claim 1, further comprising a bias compensation circuit comprising a DC power supply, a resistor, diode, and a high voltage switch, the bias compensation circuit disposed between a point on the plasma sheath control system between the blocking diode and the RF power supply.

6. The plasma sheath control system according to claim 1, further comprising a matching network electrically coupled with the plasma chamber that matches a reactive impedance of a plasma load within the plasma chamber to an output impedance of the RF power supply.

7. The plasma sheath control system according to claim 1, wherein the blocking diode rectifies the A sinusoidal waveform creating an A sinusoidal waveform with a substantially flat portion for at least 25% of each period.

8. A plasma sheath control system comprising:
   an RF power supply that produces a sinusoidal waveform with a frequency greater than 20 kHz and a peak voltage greater than 1 kV;
   a plasma chamber electrically coupled with the RF power supply, the plasma chamber having a plurality of ions that are accelerated into a surface disposed within the plasma chamber with energies greater than about 1 kV, and the plasma chamber produces a plasma sheath within the plasma chamber from the sinusoidal waveform;
   a blocking diode electrically connected between the RF power supply and the plasma chamber, the blocking diode rectifies the sinusoidal waveform; and
   a resistive output stage comprising a resistor and an inductor arranged in series, the resistive output stage disposed between a point on the plasma sheath control system between the blocking diode and the plasma chamber and ground, the resistive output stage discharges capacitive charges from within the plasma chamber with a peak voltage greater than 1 kV and with a discharge time that less than 250 nanoseconds.

\* \* \* \* \*